US011255902B2

(12) United States Patent
Ide

(10) Patent No.: US 11,255,902 B2
(45) Date of Patent: Feb. 22, 2022

(54) APPARATUSES FOR SELECTIVE TSV BLOCK TESTING

(71) Applicant: MICRON TECHNOLOGY, INC., Boise, ID (US)

(72) Inventor: Akira Ide, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 151 days.

(21) Appl. No.: 16/138,435

(22) Filed: Sep. 21, 2018

(65) Prior Publication Data

US 2020/0096558 A1    Mar. 26, 2020

(51) Int. Cl.
*G01R 31/28* (2006.01)
*H01L 25/065* (2006.01)

(52) U.S. Cl.
CPC ...... *G01R 31/2853* (2013.01); *H01L 25/0657* (2013.01); *H01L 2225/06541* (2013.01); *H01L 2225/06596* (2013.01)

(58) Field of Classification Search
CPC ....... H01L 25/0657; H01L 2225/06541; H01L 2225/06596; H01L 22/34; G01R 27/14; G01R 31/31717
USPC .................................................. 324/762.03
See application file for complete search history.

(56) References Cited

U.S. PATENT DOCUMENTS

| 6,349,101 B1 * | 2/2002 | Yamashita | ............ | H04J 3/1617 370/395.1 |
|---|---|---|---|---|
| 6,734,723 B2 | 5/2004 | Huijsing et al. | | |
| 6,753,727 B2 | 6/2004 | Magoon et al. | | |
| 6,914,480 B2 | 7/2005 | Arai et al. | | |
| 8,031,001 B2 | 10/2011 | Ide | | |
| 8,514,015 B2 | 8/2013 | Chen | | |
| 8,994,404 B1 | 3/2015 | Or-bach et al. | | |
| 9,411,015 B2 | 8/2016 | Yokou et al. | | |
| 9,627,340 B2 | 4/2017 | Kouchi | | |

(Continued)

FOREIGN PATENT DOCUMENTS

| CN | 104414631 A | 3/2015 |
|---|---|---|
| CN | 107332394 A | 11/2017 |

(Continued)

OTHER PUBLICATIONS

U.S. Appl. No. 16/568,090 titled "Apparatuses and Methods for a Chopper Instrumentation Amplifier" filed Sep. 11, 2019.

(Continued)

*Primary Examiner* — Jermele M Hollington
*Assistant Examiner* — Courtney G McDonnough
(74) *Attorney, Agent, or Firm* — Dorsey & Whitney LLP

(57) ABSTRACT

Embodiments of the disclosure are drawn to apparatuses and methods for testing through silicon vias (TSVs) which may be used, for example, to couple layers of a semiconductor memory device. The TSVs and/or the die around the TSVs may require testing. A switch circuit may be used to selectively couple one or more test circuits to an amplifier. The test circuits may generate a voltage that is related to one or more parameters of the TSV being tested. The amplifier may amplify the voltage, which may be used to determine if the TSV passes the particular test determined by the test circuit selected by the switch circuit. The switch circuit and/or other components of the test circuits may be controlled by control signals to determine the operation of a particular test.

18 Claims, 16 Drawing Sheets

(56) References Cited

U.S. PATENT DOCUMENTS

| | | |
|---|---|---|
| 10,020,046 B1 | 7/2018 | Uemura |
| 10,432,158 B1 | 10/2019 | Ide |
| 10,797,033 B2 | 10/2020 | Ide |
| 10,797,664 B2 | 10/2020 | Ide |
| 2002/0190734 A1* | 12/2002 | Burt .................... H03F 3/45475 324/713 |
| 2003/0189461 A1 | 10/2003 | Huijsing et al. |
| 2003/0231054 A1 | 12/2003 | Magoon et al. |
| 2006/0158244 A1 | 7/2006 | Kejariwal et al. |
| 2007/0237264 A1 | 10/2007 | Huang et al. |
| 2008/0273106 A1 | 11/2008 | Amini et al. |
| 2010/0013512 A1* | 1/2010 | Hargan ................ G11C 29/022 324/762.02 |
| 2011/0093224 A1* | 4/2011 | Ide ...................... G11C 29/025 702/64 |
| 2012/0134193 A1 | 5/2012 | Ide |
| 2012/0319717 A1* | 12/2012 | Chi ................ G01R 31/31717 324/756.05 |
| 2013/0032934 A1 | 2/2013 | Fisch |
| 2013/0135004 A1 | 5/2013 | Hashimoto et al. |
| 2013/0153896 A1 | 6/2013 | Whetsel |
| 2013/0249578 A1* | 9/2013 | Yokou ................ G11C 29/1201 324/750.3 |
| 2013/0293255 A1 | 11/2013 | Wu et al. |
| 2014/0140138 A1* | 5/2014 | Tran .................... G11C 29/021 365/185.18 |
| 2014/0241022 A1 | 8/2014 | Nakanishi et al. |
| 2014/0312967 A1 | 10/2014 | Nagahisa |
| 2016/0027706 A1 | 1/2016 | Bringivijayaraghavan et al. |
| 2016/0258996 A1 | 9/2016 | Lim et al. |
| 2017/0245035 A1 | 8/2017 | Lee et al. |
| 2017/0358327 A1 | 12/2017 | Oh et al. |
| 2018/0337209 A1 | 11/2018 | Narui et al. |
| 2020/0020635 A1 | 1/2020 | Chang et al. |
| 2020/0044617 A1 | 2/2020 | Ide |
| 2020/0075568 A1 | 3/2020 | Ide |

FOREIGN PATENT DOCUMENTS

| | | |
|---|---|---|
| CN | 107994883 A | 5/2018 |
| KR | 20140146822 A | 12/2014 |
| TW | 201001902 A | 1/2010 |
| TW | 201642256 A | 12/2016 |

OTHER PUBLICATIONS

International Search Report and Written Opinion for Application No. PCT/US2019/044518, dated Nov. 19, 2019.

U.S. Appl. No. 16/052,586, titled "Apparatuses and Methods for a Chopper Instrumentation Amplifier", filed Aug. 1, 2018, all pages.

U.S. Appl. No. 16/121,377 titled "Apparatuses and Methods for High Sensitivity TSV Resistance Measurement Circuit" filed Sep. 4, 2018, all pages.

International Search Report and Written Opinion for Application No. PCT/US2019/052107, dated Jan. 6, 2020.

U.S. Appl. No. 17/021,755 titled "Apparatuses and Methods for High Sensitivity TSV Resistance Measurement Circuit" filed Sep. 15, 2020.

English translation of TW Office Action for Application No. 108129484, dated Jun. 2, 2020.

* cited by examiner

APPARATUSES FOR SELECTIVE TSV BLOCK TESTING

BACKGROUND

Semiconductor devices may be used for a variety of applications, such as semiconductor memory devices used to store and retrieve information in computer systems. Modern semiconductor devices may contain multiple chips (or dies) which are stacked on top of one another. In order to provide communication between the layers of the stack, it may be necessary to provide conductive elements, such as through silicon/substrate vias (TSVs), to couple the layers. The TSVs may be arranged in a TSV block on one or more of the dies. Test circuitry may be provided in the semiconductor device to determine characteristics of the TSV block in order to test for proper operation of the semiconductor device.

FIG. 1 shows a prior art memory device 100 with a leakage test circuit. The memory device 100 may include a memory chip (core chip or core die) 102 stacked on top of an interface chip (IF chip or IF die) 104. The memory die 102 is coupled to the IF die 104 by conductive elements between the layers, generally known as TSVs 110.

FIG. 1 shows an example memory device 100 which is configured to measure a leakage current between adjacent TSVs 110 in a TSV block. The IF die 104 may include test circuitry to measure the leakage current including a replica circuit 108 and a comparator 106. The TSVs 110 may be selectively coupled to test circuitry with buffer circuits 114, 116 such that the leakage current between a target TSV 110' and an adjacent TSV 110" may be measured.

When a target TSV 110' is selected, the TSV buffer circuit 116 in the IF die 104 is activated to allow current to flow from a lower portion of the target TSV 110'. However, the TSV buffer circuit 114 which is coupled to an upper portion of the target TSV 110' is deactivated. Instead, the TSV buffer circuit 114 in the memory die 102 of an adjacent TSV 110" is activated. This creates a circuit path that allows current to flow from the TSV buffer 114 into the adjacent TSV 110" and then through the target TSV 110' via leakage path 118. This creates a voltage which is coupled by the activated TSV buffer circuit 116 to a first terminal of the comparator 106. The replica circuit 108 may contain a model of the circuit path between the target TSV 110' and the adjacent TSV 110" along the leakage path 118. The replica circuit 108 may use a reference resistor as a model for the leakage path 118, and may provide a reference voltage to another terminal of the comparator 106. The comparator may provide an output based on a comparison between the voltage caused by current through the leakage path 118 and the reference voltage.

FIG. 2 shows a prior art memory device 200 with a crack detection test circuit. FIG. 2 illustrates another example of a test circuit that may be used to measure properties of the TSV block in the memory device 200. The memory device 200 includes a memory die 202 (represented here in a 'top down' view) including a number of TSVs 210 arranged in a TSV block. As shown in FIG. 2, there is a crack 220 in the surface of the die 202. The memory die 202 includes a test circuit to determine the presence of the crack 220, the test circuitry including a voltage source 209, a judgement voltage source 208, and a comparator 206. The voltage source 209 is coupled to one input of the comparator 206 along crack test path 207 which is a conductive path which loops around the TSVs 210 of the TSV block without being coupled to the TSVs 210. The crack test path 207 is also selectively coupled to ground via a reset circuit 211 which can be activated to drop a voltage of the crack test path 207 to a ground voltage of the circuit.

During a crack test of the memory device 200, the voltage of the crack test path 207 is first reset to ground by activating the reset circuit 211. The voltage source 209 is then activated to charge the voltage of the crack test path 207 (through the capacitor coupled to ground shown near the comparator 206). The voltage of the crack test path 207 is provided to the comparator 206 as an input. The judgment voltage source 208 provides a judging voltage to the other input of the comparator 206. When there is a crack 220, the resistance along the crack test path 207 is increased, which inhibits increasing the voltage provided to the comparator 206. Accordingly, the comparator 206 may provide a result based on if the voltage of the crack test path 207 is less than the judging voltage.

FIG. 3 shows a prior art IF die 300. The IF die 300 is shown as both a block diagram representation 322 and 323. The IF die 300 may include one or more TSV blocks 324 and one or more TSV test blocks 325 which may include the test circuitry (e.g., the test circuitry components described in FIGS. 1 and 2). The TSV block(s) 324 may be vertically aligned with TSV blocks in memory dies stacked on the IF die 300. The TSV blocks 324 in the IF die 300 may be regions of the IF die 300 containing the TSVs (e.g., TSVs 110) which couple the IF die 300 to other dies of the memory device. The TSV test block 325 may be located underneath the TSV block 324. The TSV test block 325 may be located in a region of the IF die 300 which is vertically aligned with the area of the TSV block 324. Multiple TSV test blocks 325 may be arranged underneath multiple TSV blocks 324. The TSV test blocks 325 may repeat at intervals based on how many individual TSVs each TSV test block 325 is capable of testing.

It may be necessary to locate the TSV test block 325 in an area of the IF die 300 underneath the TSV blocks 324 in order to, for example, reduce resistance of the wiring between the TSV test block 325 and the TSV block 324. The TSV test block 325 may contain bulky and/or power intensive components such as amplifiers (which may be used, for example, as the comparators 106, 206 of FIGS. 1 and 2). Multiple amplifiers may need to be provided for each test circuit that the TSV test block 325 is coupled to. Accordingly, the location of, and number of components in, the test circuitry may increase a size of the memory device.

DETAILED DESCRIPTION

Figure 1:
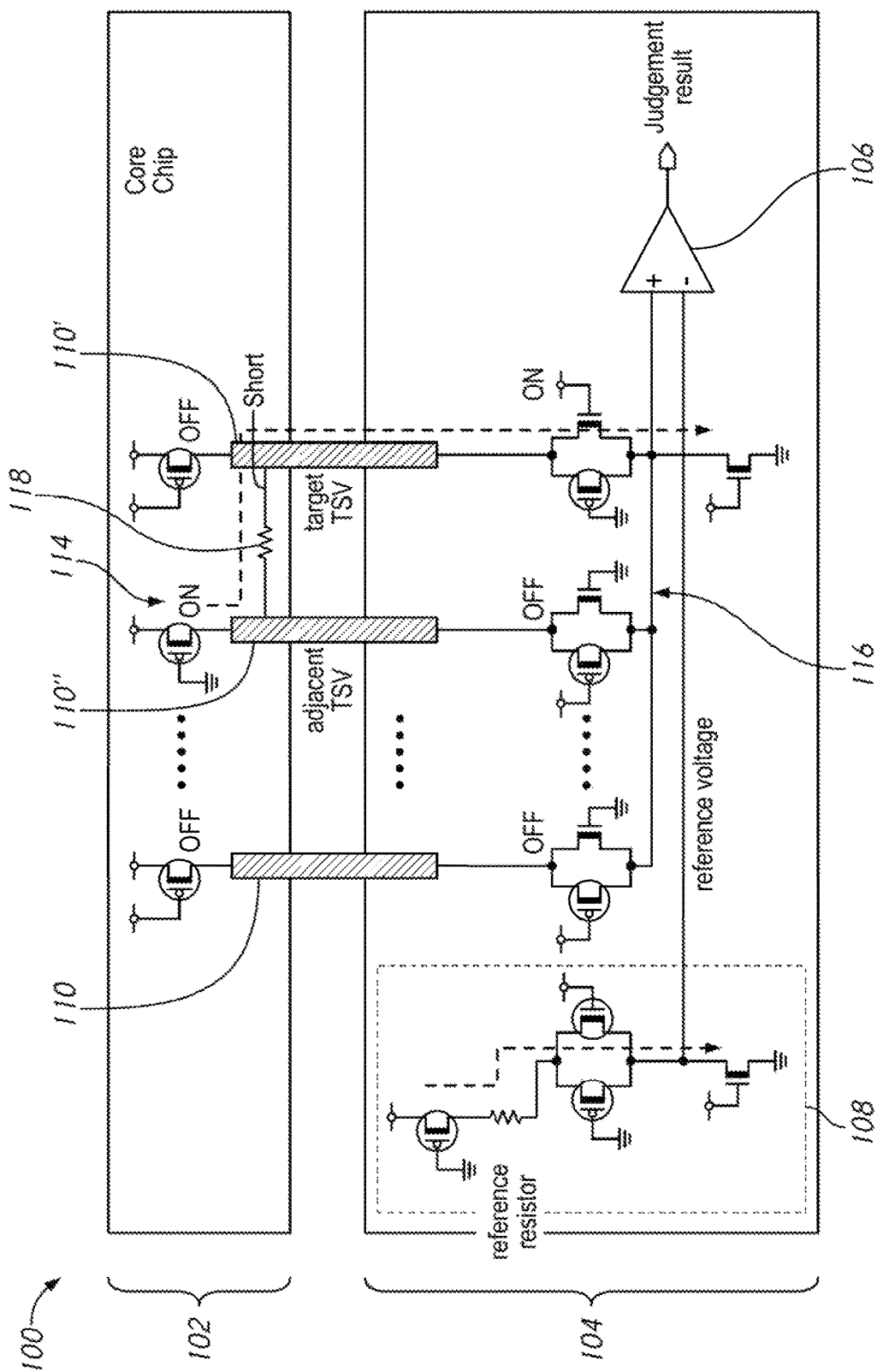
FIG. 1 is a schematic diagram of a prior art memory device with a leakage test circuit.
Figure 2:
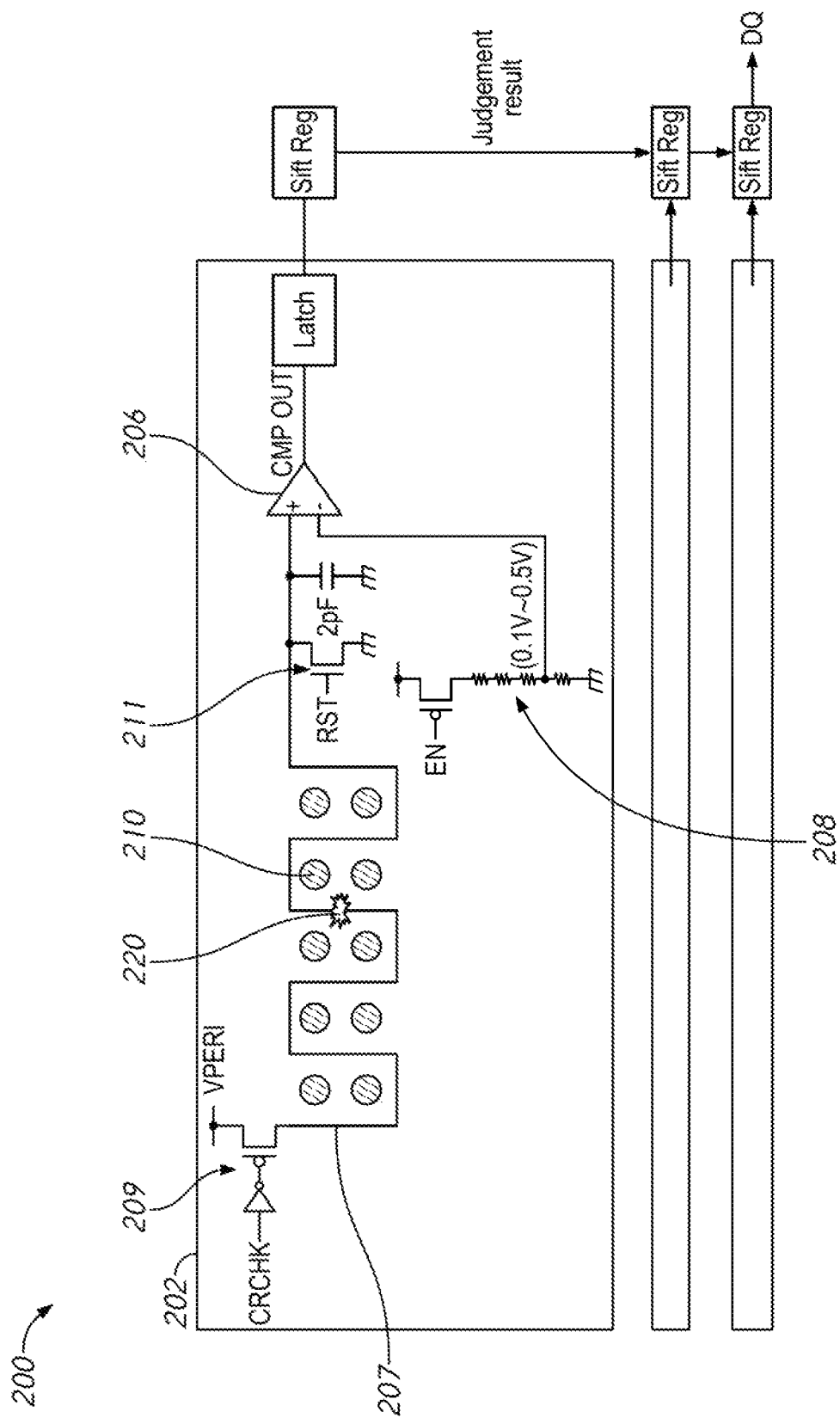
FIG. 2 is a schematic diagram of a prior art memory device with a crack detection test circuit.
Figure 3:
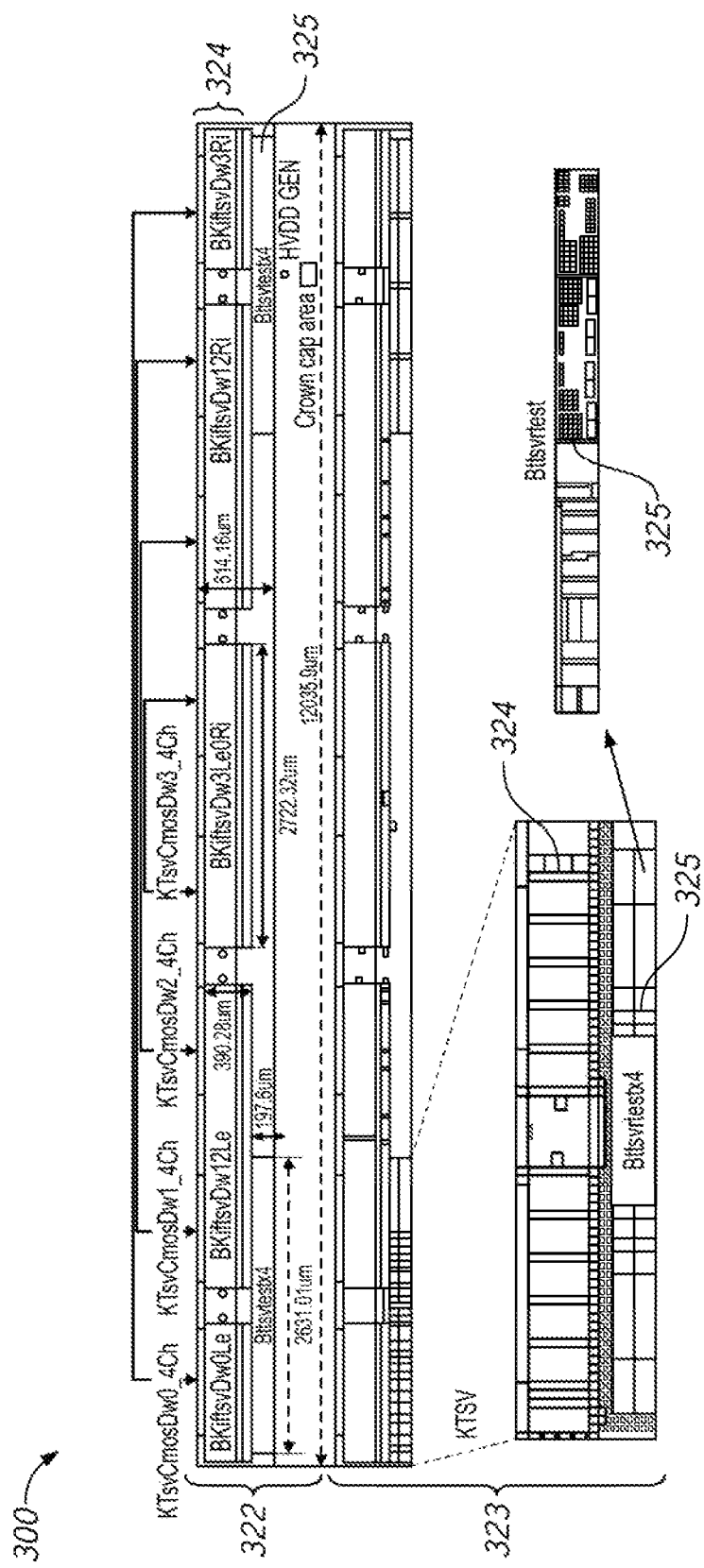
FIG. 3 is a block diagram of a prior art IF die.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Layers of a semiconductor device, such as a memory device, may be coupled together by conductive elements, such as through silicon/substrate vias (TSVs). The TSVs (individually, or in groups) and/or regions of the layer containing the TSVs may require testing to ensure proper operation of the semiconductor device. It may be desirable to perform a variety of different tests to ensure that the properties of the TSVs and the layers fall within an acceptable range. One example test is a TSV resistance test which may measure a resistance through the TSV to ensure proper coupling between layers of the device. Another example test is a TSV short test (or TSV leak test) which may measure the leakage of current out of the TSV to various other components of the device (e.g., current leakage into adjacent TSVs). Another example test is a crack test which may use wiring positioned around the TSVs to determine if there is a crack in the layer containing the TSVs. It may be desirable to combine circuits for multiple tests onto a single chip. However, testing circuitry may involve bulky circuit components (such as amplifiers and/or comparators).

The present disclosure is aimed at providing apparatuses and methods for a semiconductor device with multiple test circuits coupled to an amplifier through a switch circuit. The switch circuit may selectively couple one or more of test circuits to the amplifier, which may provide a result of the test (e.g., an output voltage). The amplifier and/or switch circuit may be located in an interface (IF) die underneath other layers of the device. The amplifier and/or switch circuit may be located in an area of the IF die which is outside the area of the IF die underneath the TSVs of the other layers stacked on the IF die. Since the test circuits may share components (e.g., through the switch circuit), less components may need to be provided, and the test circuits may take up less space (e.g., overhead) on the memory device.

Embodiments of the present disclosure may be referenced with respect to certain descriptions of orientation (e.g., an upper surface, a lower portion, vertical alignment, etc.). It should be understood that these are used for descriptive purposes only to describe the relative positioning of certain components to each other, and that embodiments of the present disclosure may have any orientation in space.

Figure 4:
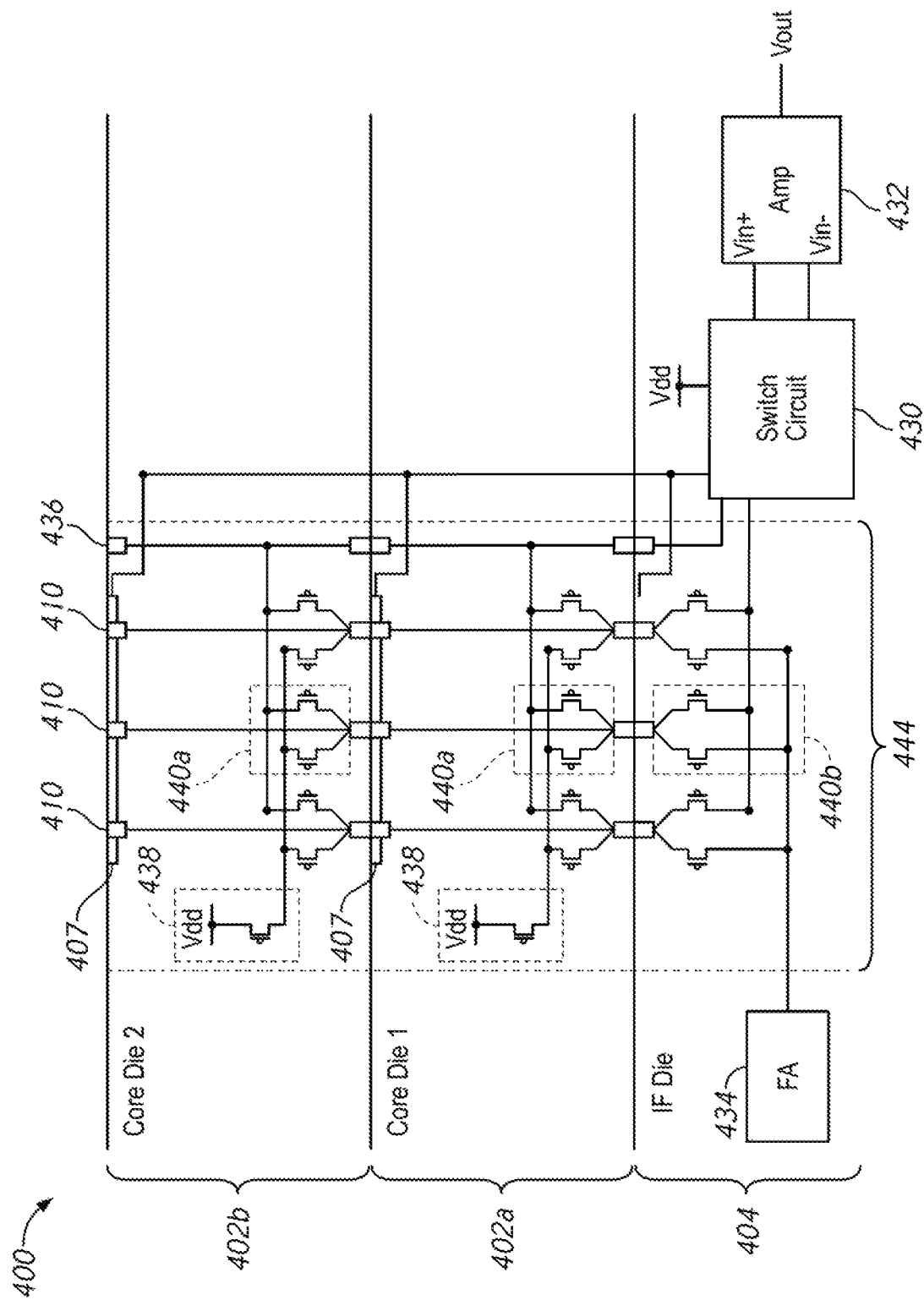
FIG. 4 is a schematic diagram of a memory device according to an embodiment of the present disclosure.

FIG. 4 shows a memory device 400 according to an embodiment of the present disclosure. Although a memory device 400 is described as an example application of the present disclosure, it is to be understood that the TSVs and TSV testing circuits of the present disclosure may be used with any integrated circuit device involving stacked elements. The memory device 400 includes an interface die (interface chip, IF die) 404 and two memory dies (core dies, memory chips) 402*a-b* stacked on the IF die 404 to form layers of the memory device 400. Although only two memory dies 402*a-b* are shown, it is to be understood that this is for illustration purposes only, and that any number of memory dies 402 may be stacked on the IF die 404. The memory dies 402*a-b* are coupled to each other and to the IF die 404 by through silicon vias (TSVs) 410 and 436, which are conductive elements positioned to couple the layers of the memory device 400. The memory device 400 may include signal TSVs 410 and sense TSVs 436 arranged in columns through the memory device 400. Each of the memory dies 402*a-b* may include a current supply circuit 438, crack test path 407, and TSV buffer circuits 440*a*. The IF die 404 may include a force amplifier 434 and a switch circuit 430 which may be selectively coupled to the signal TSVs 410 by TSV buffer circuit 440*b*. The switch circuit 430 may selectively couple a variety of different test circuits (described herein) to an amplifier 432, in order to run a number of different TSV tests using a single amplifier 432.

In some embodiments, the memory device 400 may be a dynamic random access memory device (DRAM). In some embodiments, the memory device 400 may be high bandwidth memory (HBM). The memory device 400 may include memory dies 402*a-b* which are stacked together on an IF die 404. Each of the memory dies 402*a-b* may include internal circuitry (not shown) such as memory cells. The IF die 404 may contain interface components, such as an I/O circuit of the memory device 400. The signal TSVs 410 may selectively couple the internal circuitry of the memory dies 402*a-b* to the interface components of the IF die 404. Although a particular configuration of memory device 400 is shown in FIG. 4, it is to be understood that various arrangements may be made. For example, more or less layers of memory dies may be provided in a different arrangement of the memory device 400.

The TSVs 410, 436 may be conductive elements which couple layers of the semiconductor memory device 400 together. Each TSV 410, 436 may include an upper portion positioned along an upper surface of a layer, and a lower portion positioned along a lower surface of a layer. The upper and lower portions of each TSV may be coupled together by a conductive path that passes through the layer. The upper and lower portions of each TSV may include contacts positioned on an upper and lower surface of the layer 402a-b for coupling to a corresponding contact on an adjacent layer. Accordingly, when the dies are stacked, the upper and lower portions of corresponding TSVs may be coupled, allowing for electrical coupling between the layers. The TSVs may couple adjacent layers together, thus memory die 402b is coupled to memory die 402a, while memory die 402a is coupled to both memory die 402b and the IF die 404. The TSVs may also be coupled together in columns by coupling the upper portion of a TSV along an upper surface of a die to the lower portion of a corresponding TSV along a lower surface of an adjacent die. Each of the memory dies 402a-b may be physically identical to each other, thus when stacked there may be contacts for upper portions of TSVs along an upper surface of the top die (e.g., memory die 402b) that are not coupled to any corresponding lower TSV portions.

The IF die may contain input/output (I/O) circuitry (not shown) which couples the memory device 400 to external components. Each memory die 402a-b may contain information stored in memory cells (not shown) which are coupled to the IF die 404 along the signal TSVs 410. The IF die 404 may provide data to be stored in the memory cells during a write operation, and may receive data from the memory cells during a read operation. In some embodiments, since the IF die 404 is positioned at a bottom of the stack of layers of the memory device 400, the IF die 404 may have TSVs 410, 436 which have upper portions positioned along a top surface of the IF die 404, but which do not have corresponding lower portions.

As described herein, the signal TSVs 410 in each layer may be selectively coupled to a variety of different test circuits contained in the memory device 400. In general, the test circuits may provide a voltage resulting from the test performed (e.g., a resistance test may pass a known current through a resistive element to generate a voltage). The voltage provided by the test circuits may represent test results from the test performed. The switch circuit 430 may selectively activate the test circuits and couple them to the amplifier 432, which may amplify the voltage provided by the test and provide it as an output voltage Vout. The output voltage Vout may be used to judge a result of the test. Examples of arrangements and couplings of components that various test circuits may form are described in FIGS. 5-15. An example of a switch circuit is described in more detail in FIG. 16.

The amplifier 432 is coupled to the switch circuit 430, and receives first (Vin+) and second (Vin−) input voltages from the switch circuit 430. The voltages Vin+ and/or Vin− may be results of a test circuit coupled through the switch circuit 430. In some embodiments, the second input voltage Vin− may be a reference voltage provided by a reference circuit selectively coupled through the switch circuit 430. In some embodiments the amplifier 432 may be a differential amplifier, which amplifies a voltage difference between Vin+ and Vin−. The amplifier may provide an output Vout which is a multiple of the differential voltage input Vdif1 (e.g., Vx). The differential input voltage Vdif1 may be related to the output Vout by a gain, which may be greater than one. Accordingly, the output Vout may be increased from the input Vdif1. In some embodiments, the amplifier 432 may be an instrumentation amplifier. An instrumentation amplifier may be a multi-stage amplifier which may have a reduced need for impedance matching of the input terminals compared to other types of amplifier.

The TSV buffer circuits 440a-b may be used to select one or more signal TSVs 410 for testing. The TSV buffer circuits 440a may be provided in the memory dies 402a-b coupled to the lower portion of signal TSVs 410 in each of the memory dies 402a-b, while TSV buffer circuits 440b may be provided in the IF die 404 coupled to the upper portion of the signal TSVs 410 in the IF die 404. Each TSV buffer circuit 440a-b may include transistors, which may act as switches and may be used to selectively couple a given signal TSV to other components such as the current supply circuit 438, force amplifier 434, and/or switch circuit 430. The transistors of the TSV buffer circuits 440a-b may be coupled to one or more control signals (not shown) which may be provided by control circuits, such as shift registers.

As shown in FIG. 4, each of the memory dies 402a-b includes a current source circuit 438. The current source circuit 438 may be a transistor acting as a switch to selectively couple a power supply voltage (Vdd) to a line Force+ coupled to the TSV buffer circuits 440a. The TSV buffer circuits 440b selectively couple the signal TSVs 410 to a force amplifier 434. In some test circuits, the force amplifier 434 may operate in conjunction with the current source circuit(s) 438 to drive a current from the current source circuit 438, through a selected line of signal TSVs and to the force amplifier 434. The current source circuit 438 and/or force amplifier 434 may only be used in certain testing operations (as determined by the test circuits coupled by the switch circuit 430) and thus may be inactive during certain tests. In some embodiments, rather than being located in each memory die 402a-b, there may be a single current source circuit 438 (e.g., located in the IF die 404) which is coupled along TSVs to the memory dies 402a-b.

Crack test path 407 may be provided along the surface of one or more of the memory dies 402a-b. The crack test path 407 may include a conductive path that winds around at a least a portion of a perimeter of one or more of the signal TSVs 410 without coupling to the signal TSVs 410. As depicted in the view of FIG. 4, the crack test path 407 is seen along its edge. The layout of the crack test path 407 will be discussed in FIGS. 12-15. As shown in FIG. 4, the crack test path may be disposed along an upper surface of the memory die 402a-b (e.g., winding around the upper portions of signal TSVs 410). However, in other examples the crack test path may be disposed in other locations, such as along the bottom surface of the memory dies 402a-b or along both the upper and lower surfaces of the memory dies 402a-b. The crack test path may be selectively coupled to the amplifier 432 via the switch circuit 430.

The switch circuit 430 and/or other test components of the memory device 400 (e.g., the current supply circuit 438, the TSV buffer circuits 440a-b, the crack test circuits 407, the force amplifier 434 etc.) may receive one or more control signals. The control signals may determine the operation of switch circuit 430 and other test components. As an example, the control signals may operate the switch circuit 430 and the TSV buffer circuits 440a-b to couple a target TSV 410 for testing to the amplifier 432. The control signals may be provided from components external to the memory device 400 (e.g., a memory controller coupled to the memory device 400). In some embodiments, one or more of the control signals may be provided by additional components of the memory device 400 (not shown), such as, for example, shift register circuits positioned in each memory die 402a-b and IF die 404.

The TSVs 410, 436 of the memory dies 402a-b and/or IF die 404 may be arranged in a TSV block 444. Corresponding TSVs may have upper and lower portions which are vertically aligned with each other such that they are coupled when stacked. The TSV block 444 may be a region of the memory dies 402a-b where the TSVs are located (shown between the dotted lines of FIG. 4). The TSV block 444 may be a region of each of the memory dies 402a-b and the IF die 404 which are vertically aligned with each other. The TSV block 444 in the IF die 404 may include an area containing the upper portions of the TSVs 410, 436 in the IF die 404. In some embodiments, the test circuitry components of the IF die 404 (e.g., the switch circuit 430, amplifier 432, and/or force amplifier 434) may be located in an area of the IF die 404 outside of the TSV block 444 (e.g., in an area of the IF die 404 which is not underneath the TSV blocks 444 of the memory dies 402a-b). In some embodiments, the test circuitry components may be located in a vacant area of the IF die 404 (e.g., an area of the IF die which does not contain other components). Location of the test circuitry components outside of the TSV block region of the IF die 404 may lead to a reduced footprint of the memory device 400.

FIGS. 5-16 depict a variety of different test circuits according to various embodiments of the present disclosure. In some embodiments, one or more of the test circuits may be implemented in the memory device 400 of FIG. 4. Each of these test circuits may involve one or more circuit components (e.g., current source circuit 438, TSV buffer circuits 440a-b) which may be selectively activated and/or deactivated, and coupled along a circuit path to the amplifier 432 via the switch circuit 430. For brevity, each of FIGS. 5-15 highlight only a single active test circuit. However the memory device 400 may include multiple different test circuits all selectively coupled through the switch circuit 430 to the amplifier 432. For clarity of illustration, each of FIGS. 5-16 omits the layered structure of the memory device 400, however it is to be understood that the components shown in FIGS. 5-16 may be disposed in one or more layers (e.g., in one or more of the memory die 402a-b and/or the IF die 404) of the memory device 400.

Figure 5:
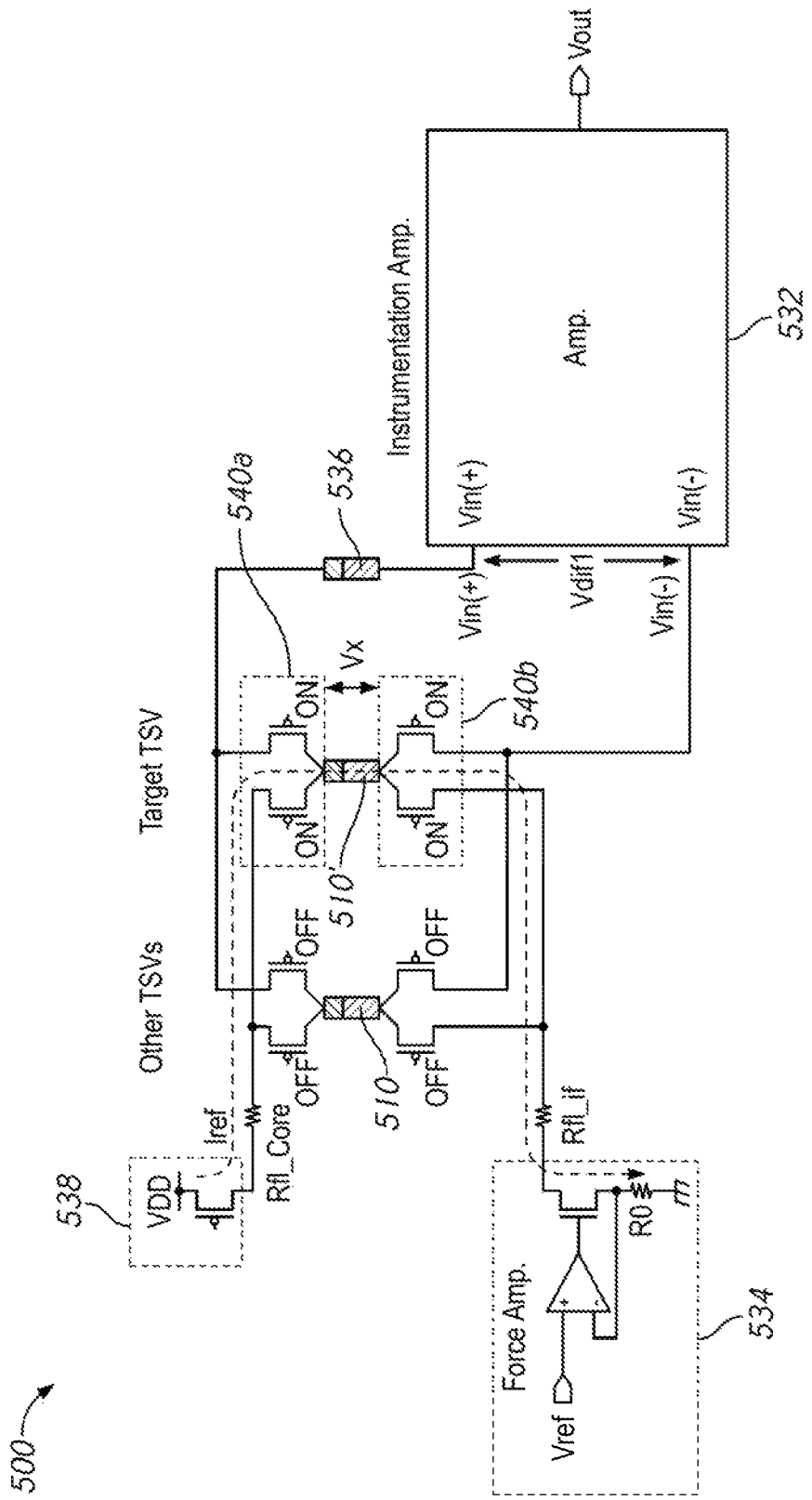
FIG. 5 is a schematic diagram of TSV resistance test circuit according to an embodiment of the present disclosure.

FIG. 5 is a schematic diagram of TSV resistance test circuit 500 according to an embodiment of the present disclosure. The TSV resistance test circuit 500 may be implemented in the memory device 400 of FIG. 4 when the switch circuit 430 makes certain couplings to the amplifier. The test performed by the TSV resistance test circuit 500 may determine if a given TSV has sufficient conductivity (e.g., low enough resistance). The TSV resistance test circuit 500 may be used, for example, to determine if the layers of the memory device are sufficiently coupled along the TSVs.

The TSV resistance test circuit 500 includes a target TSV 510' which will have its resistance tested as well as other TSVs 510 and a signal TSV 536. The TSVs 510', 510, and 536 may couple layers of semiconductor memory device together. The target TSV 510' and non-selected TSVs 510 are coupled to TSV buffer circuits 540a and 540b. The TSV buffer circuits 540a and 540b include transistors which may act as switches. The target TSV 510' has all four switches in the coupled TSV buffer circuits 540a-b activated, while the non-selected TSVs 510 are coupled to TSV buffer circuits 540a-b which have all four switches deactivated. The non-selected TSVs 510 may be selected for future testing with the TSV resistance test circuit 500 by changing which of the TSV buffer circuits 540a-b is activated.

The current source 538 is coupled to the target TSV 510' through the TSV buffer circuit 540a. The current source 538 includes a transistor which during the TSV resistance test is activated (e.g., by application of an appropriate voltage to the gate of the transistor) to couple the target TSV 510' to the power supply voltage Vdd. The force amplifier 534 is coupled to the target TSV 510' via the TSV buffer circuit 540b. The force amplifier 534 includes a differential amplifier (e.g., an operational amplifier or op-amp) which has a non-inverting input coupled to a reference voltage Vref. The differential amplifier provides an output voltage to the gate of a transistor which has a drain coupled to the TSV buffer circuit 540b and a source coupled to ground through a resistor R0. An inverting input of the differential amplifier is coupled between the source and the resistor R0.

The TSV resistance test circuit 500 also includes a modeled core resistance Rfl_core and a modeled IF resistance Rfl_if. These may represent the resistance along the couplings between components of the TSV resistance test circuit 500 rather than specific resistance elements inserted into the circuit 500. In particular, the modeled core resistance Rfl_core represents the resistance between the current supply circuit 538 and the target TSV 510' through the memory die (e.g., memory die 402a-b of FIG. 4). Rfl_if represents the resistance between the target TSV 510' and the force amplifier 534.

The current supply circuit 538 and the force amplifier 534 work together to generate a constant reference current Iref which flows from the current supply circuit 538 through the target TSV 510' and into the force amplifier 534. The current Iref may generate a voltage Vx across the target TSV 510'. The TSV buffer circuit 540a may couple a first side of the target TSV 510' to a first input (Vin+) of the amplifier 532 via sense TSV 536. The TSV buffer circuit 540b may couple a second side of the target TSV 510' to a second input (Vin−) of the amplifier 532. Accordingly, the voltage Vx generated across the target TSV 510' by the current Iref may be the voltage difference Vdif1 between the inputs of the amplifier 532 (Vdif1=(Vin+)−(Vin−)). The amplifier 532 may provide an output Vout which is an amplified version of Vx (e.g., increased by a gain of the amplifier 532).

Figure 6:
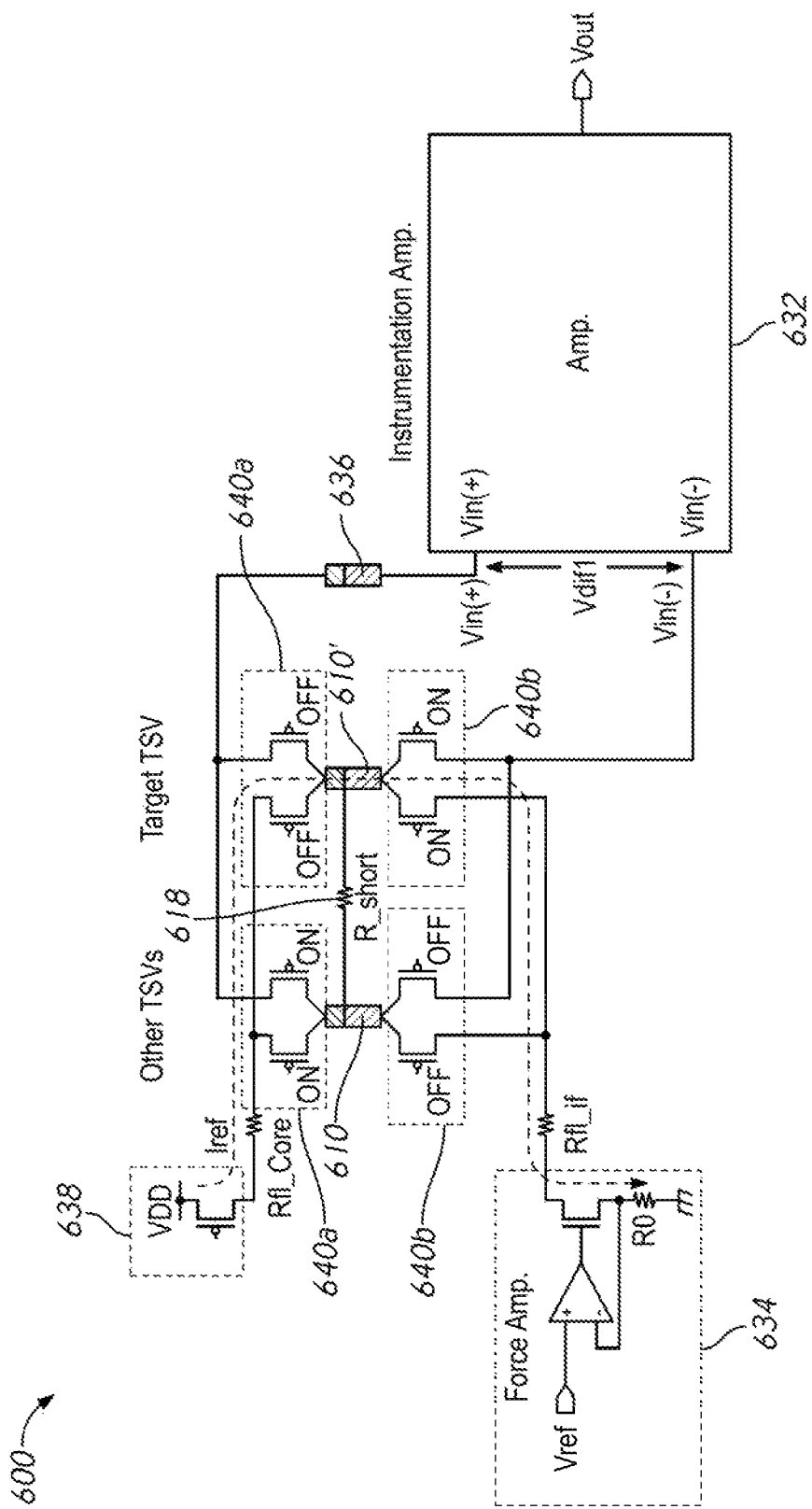
FIG. 6 is a schematic diagram of a signal to signal TSV short test circuit according to an embodiment of the present disclosure.

FIG. 6 is a schematic diagram of a signal to signal TSV short test circuit 600 according to an embodiment of the present disclosure. The layout of the signal to signal TSV short test circuit 600 may, in general, be similar to the test circuit 500 of FIG. 5. In some embodiments, the switch circuit 430 of FIG. 4 may make the same couplings to achieve the test circuit 500 and the test circuit 600, with the difference in operation provided by a difference in the activation of the TSV buffer circuits 540a-b and 640a-b.

The test circuit 600 may be used to measure a short between adjacent TSVs of the memory device. An inadvertent electrical coupling may be formed between adjacent TSVs during the manufacturing of the memory device. For example, an etching residue left on the surface may form a conductive path between adjacent TSVs. The test circuit 600 works in a similar manner to the test circuit 500 to measure a resistance by flowing a known current Iref through a resistive element, however in the test circuit 600, Iref can only flow between adjacent TSVs (rather than through a single TSV as in the test circuit 500 of FIG. 5).

Similar to the test circuit 500, the test circuit 600 includes a current supply circuit 638 and a force amplifier 634 as well as an amplifier 632. The components are coupled by TSVs including a sense TSV 636, signal TSVs 610, and a target signal TSV 610'. The signal TSVs 610, 610' are coupled to TSV buffer circuits 640a-b. For the sake of brevity components of test circuit 600 similar to their counterparts in test circuit 500 will not be described again.

In the test circuit 600, the TSV buffer circuit 640b which couples a target TSV 610' to the force amplifier 634 and amplifier 632 is activated, but the TSV buffer circuit 640a coupled to the other side of the target TSV 610' is not activated. Accordingly, the target TSV 610' is not coupled through the TSV buffer circuit 640a to the current supply circuit 638 and the other input of the amplifier 632. Instead, the TSV buffer circuit 640a of a neighboring TSV 610 (e.g., a signal TSV adjacent to the target signal TSV 610') is activated. The TSV buffer circuit 640b coupled to the neighboring TSV 610 is deactivated. Accordingly, the only path for the current Iref to flow is from the current supply circuit 638, through the buffer circuit 640a and into the neighboring TSV 610 and then across a (potential) short into the target TSV 610' and through the coupled TSV buffer circuit 640b into the force amplifier 634.

The short may be modeled by a resistor coupled between the target TSV 610' and the neighboring TSV 610, with a resistance of R_short. This may represent a stray resistance along a short path. The flow of current Iref through R_short may generate a voltage, which may be coupled to the inputs of the amplifier 632 via the TSV buffer circuit 640a coupled to the neighboring TSV 610 and the TSV buffer circuit 640b coupled to the target TSV 610'. The amplifier 632 may amplify the voltage across the short, which may be used to determine the resistance of the short (and/or if a short exists). The current Iref and the gain of the amplifier 632 may be adjusted to accurately measure/detect a wide array of values of R_short.

Figure 7B:
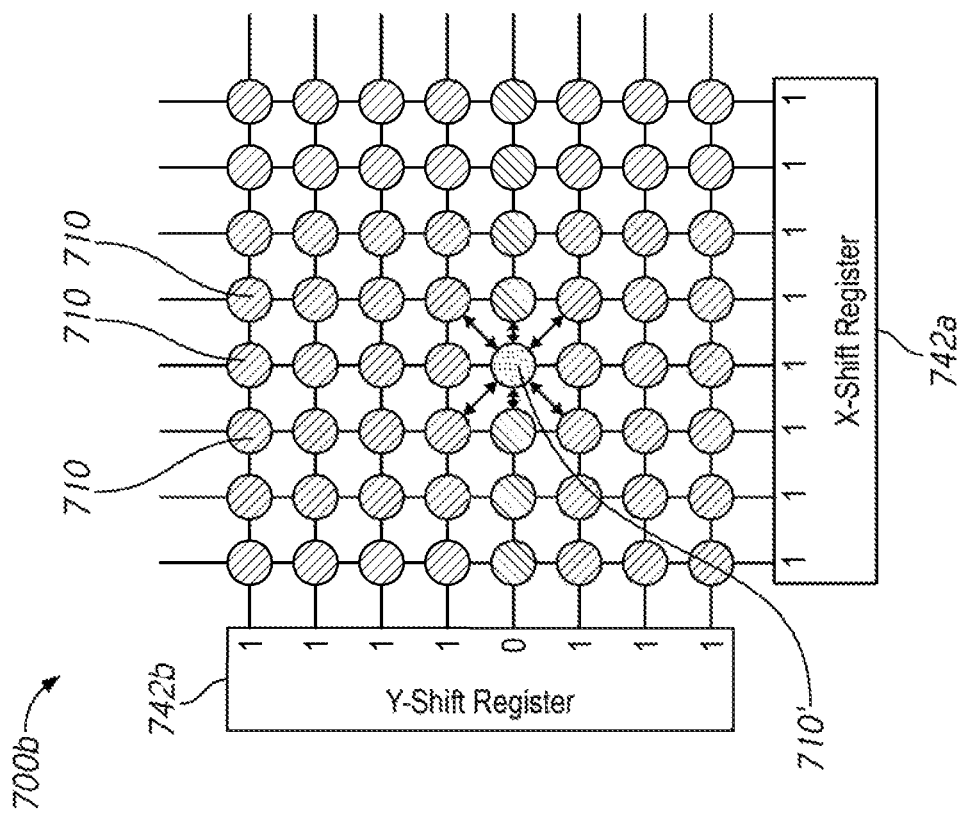
FIGS. 7A-7B are schematic diagrams of the operation of TSV blocks in a signal to signal short test configuration according to an embodiment of the present disclosure.
Figure 7A:
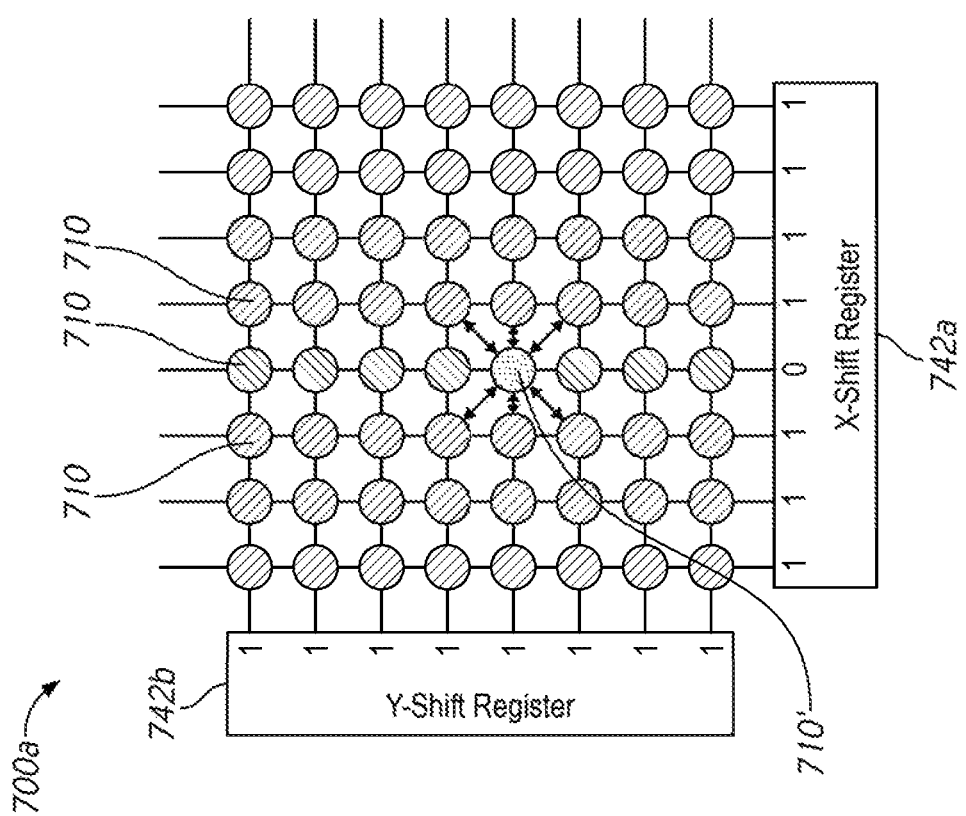

FIGS. 7A-7B are schematic diagrams of the operation of TSV blocks 700a-b in a signal to signal short test configuration according to an embodiment of the present disclosure. FIGS. 7A-7B represent a 'top down' view of TSV blocks 700a-b in which signal TSVs 710 are arranged in a grid format. In some embodiments, the TSV blocks 700a-b may implement the TSV block 444 of one of the layers of FIG. 4. Each of the signal TSVs 710, 710' may be coupled to test circuitry along a signal to signal TSV test circuit similar to the test circuit 600 of FIG. 6. FIGS. 7A-7B represent an example method of operating a TSV block 700a-b during a signal to signal TSV short test. The TSV blocks 700a-700b may represent the same TSV block at different stages of operation during a signal to signal TSV short test.

Each of the signal TSVs 710 may be coupled to an x-shift register 742a and a y-shift register 742b. The x- and y-shift registers 742a,b may be coupled to control circuits of the signal TSVs 710 (e.g., TSV buffer circuits such as TSV buffer circuit 640a of FIG. 6). As shown, the shift registers 742a,b may determine the activation of TSVs (via couple buffer circuits) along a given row or column. Accordingly, the x-shift register 742a may control activation of TSVs 710 along columns, while the y-shift register 742b may control activation of TSVs 710 along rows. In some embodiments, the shift registers 742a,b may be components of each layer (e.g., memory dies 402a-b of FIG. 4) of a given device.

A test circuit (e.g., test circuit 600 of FIG. 6) may be used to determine a short between a target TSV 710' and neighboring TSVs. As discussed with regards to FIG. 6, to test for a signal to signal TSV short, the target TSV 710' should be deactivated while neighboring signal TSVs 710 are activated. In the TSV block 700a, the column containing the target TSV 710' has been deactivated by the x-shift register. In the shift block 700a, a short may be determined between the target TSV 710' and it's neighboring TSVs 710, except for the two neighboring TSVs 710 which are in the same column as the target TSV 710'. Similarly, TSV block 700b shows a situation where the row containing the target TSV 710' is deactivated by the y-shift register 742b. In the TSV block 700b, a short may be determined between the target TSV 710' and it's neighboring TSVs 710 except for the two neighboring TSVs 710 which are in the same row as the target TSV 710'. Accordingly, in order to test for a short between all neighboring TSVs 710 around the target TSV 710' it may be necessary to operate the TSV block as shown in both TSV blocks 700a and 700b. A controller of a memory device (e.g., memory device 400 of FIG. 4) may operate the shift registers to alternate between the configuration of TSV blocks 700a-b during signal to signal TSV short testing of a given target TSV 710'. Accordingly, for any given target TSV 710', the test circuit 600 of FIG. 6 may be operated twice, once in the configuration of TSV block 700a and once in the configuration of TSV block 700b.

Figure 8:
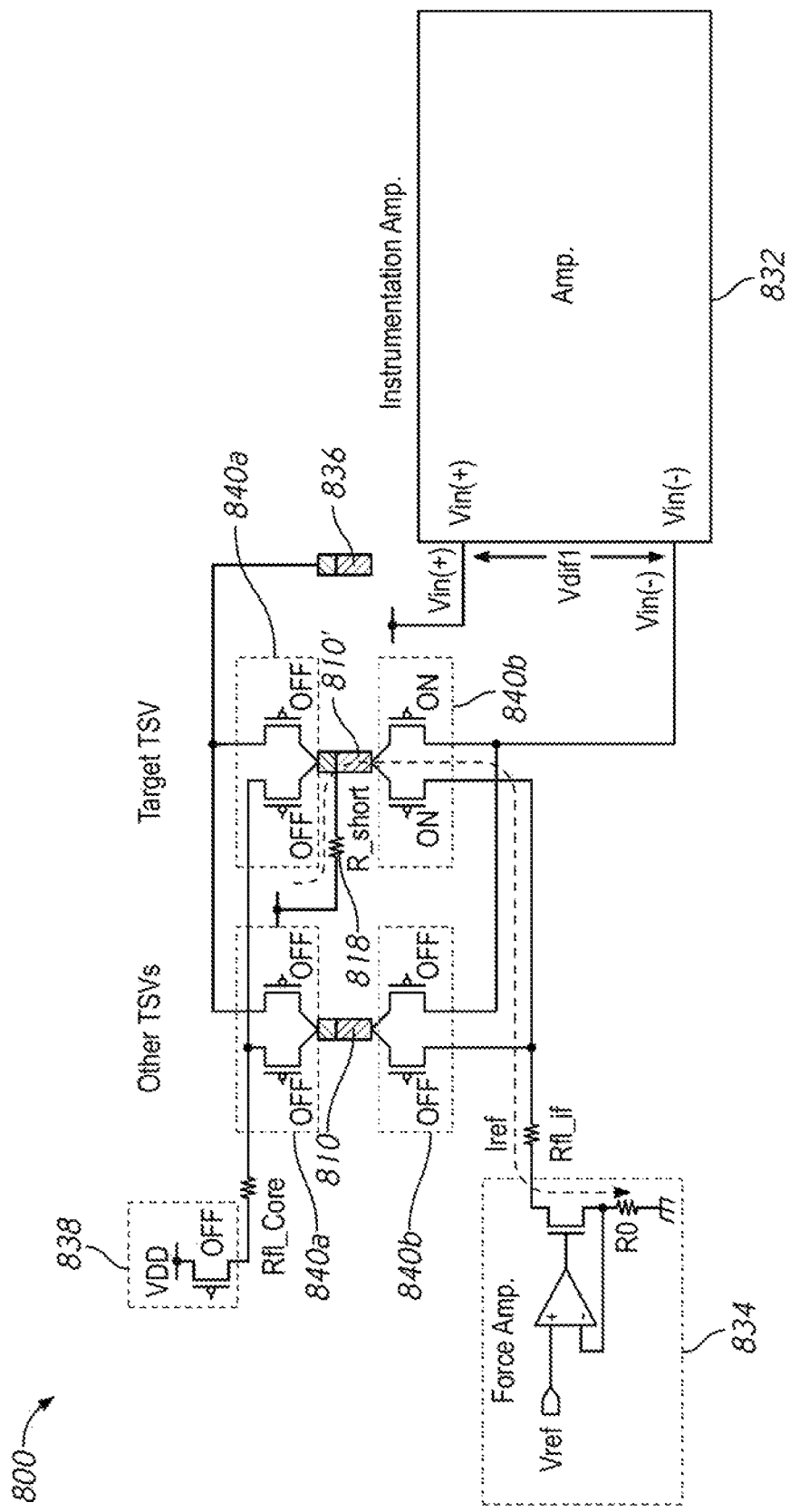
FIG. 8 is a schematic diagram of a signal to Vdd TSV short test circuit according to an embodiment of the present disclosure.

FIG. 8 is a schematic diagram of a signal to Vdd TSV short test circuit 800 according to an embodiment of the present disclosure. The test circuit 800 may generally be similar to the test circuits 500 and 600 of FIGS. 5 and 6 respectively. The test circuit 800 may be established by couplings through the switch circuit 430 of FIG. 4 and/or selective activation of circuit components (e.g., the current supply circuit 838, TSV buffer circuits 840a-b, etc.). For the sake of brevity, components similar to those already described in regards to FIGS. 4-6 will not be described again in detail here.

The signal to Vdd TSV short test circuit 800 may be used to determine/measure a short between the power supply voltage (Vdd) and a target TSV 810'. In some embodiments, the Vdd may be distributed through layers of the chip with power supply TSVs similar to the signal TSVs 810 and/or sense TSVs 836. In some examples, a short between the power TSVs and one or more of the signal TSVs 810 is possible, leading to undesirable results along the signal TSV 810. In other examples, Vdd may be shorted to a signal TSV 810 via other structures.

The test circuit 800 is configured so that a current Iref passes along a short path 818 (here modeled as a short resistor R_short) coupled between Vdd and the target TSV 810'. Similar to the test circuits 500 and 600 (of FIGS. 5 and 6) described herein, the current Iref generates a voltage which is coupled to an amplifier 832. The output voltage Vout of the amplifier 832 may be used to determine and/or measure the resistance of the short path 818.

In the example configuration of the test circuit 800, only the TSV buffer circuit 840b coupled to the target TSV 810' is activated. The TSV buffer circuit 840a coupled to the target TSV 810' and both TSV buffer circuits 840a-b of the other signal TSVs 810 are deactivated. The current supply circuit 838 is also deactivated. Accordingly, the target TSV 810' is coupled to the force amplifier 834 and to an input of the amplifier 832 via TSV buffer circuit 840b. Thus, the current Iref may only be generated by a potential short 818 between the power supply voltage Vdd and the target TSV 810'. The current Iref may flow from Vdd through the short path 818, through the target TSV 810' and TSV buffer circuit 840b and to ground via the force amplifier 834. One input of the amplifier 832 may be coupled to one side of the target TSV 810' via the TSV buffer circuit 840b, and the other input may be coupled to Vdd.

Figure 9:
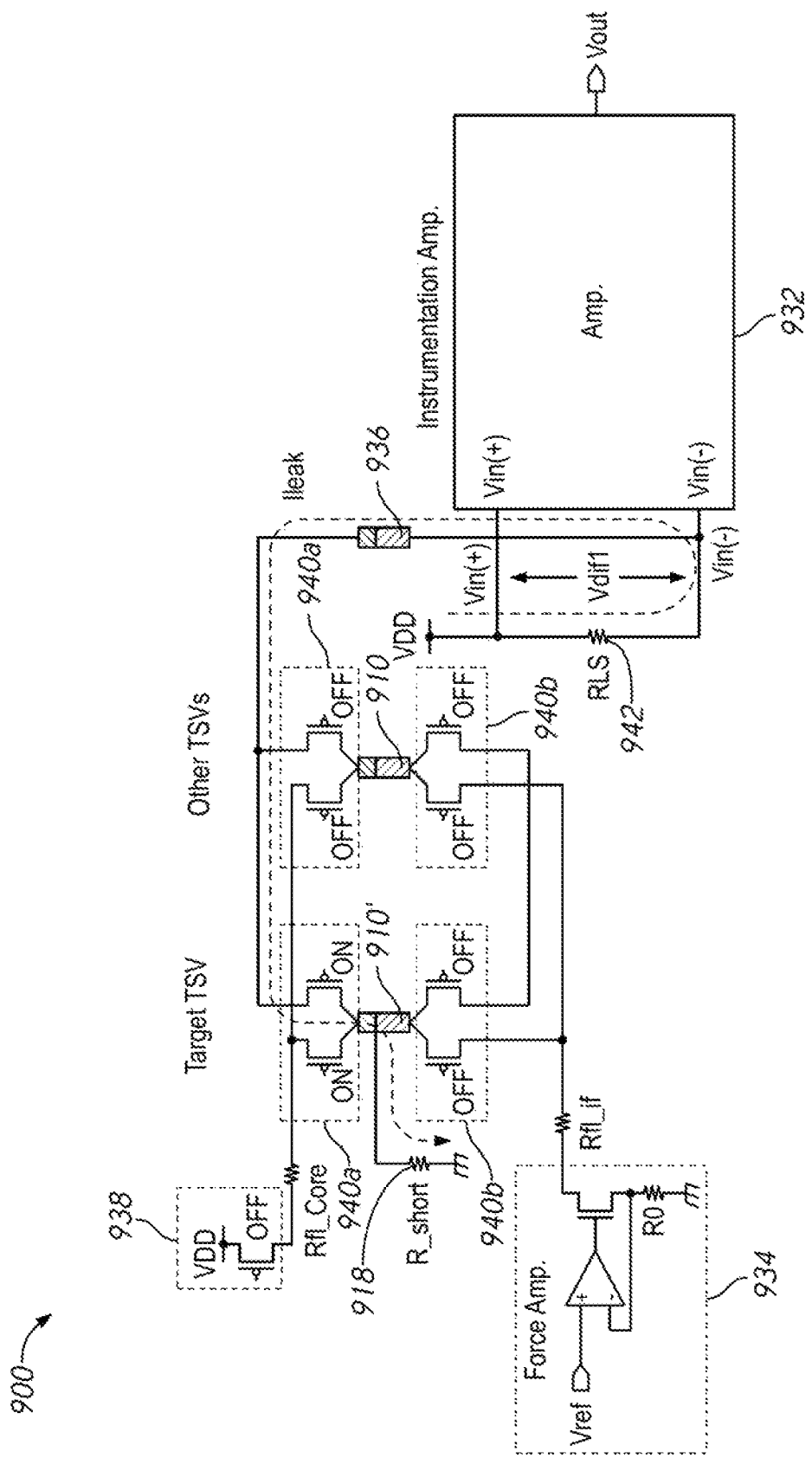
FIG. 9 is a schematic diagram of a signal to Vss TSV short test circuit according to an embodiment of the present disclosure.

FIG. 9 is a schematic diagram of a signal to Vss TSV short test circuit 900 according to an embodiment of the present disclosure. The test circuit 900 may generally be similar to the test circuits 500, 600, and 800 of FIGS. 5-6, and 8 respectively. The test circuit 900 may be established by couplings through the switch circuit 430 of FIG. 4 and/or selective activation of circuit components (e.g., the current supply circuit 938, TSV buffer circuits 940a-b, etc.). For the sake of brevity, components similar to those already described in regard to FIGS. 4-8 will not be described again in detail here.

The test circuit 900 may determine and/or measure a short between a target TSV 910' and a ground voltage (e.g., Vss). In some embodiments, the ground voltage may be distributed through the layers of the device along ground TSVs, similar to the signal TSVs 910 and sense TSVs 936. In some situations (e.g., manufacturing defect) there may be a short path 918 between the target TSV 910' and the ground voltage. In some embodiments, the short path 918 may represent a leakage path along the memory die (e.g., into a substrate of the die). The short path 918 may be modeled as a resistor R_short which is coupled to the target TSV 910' and to the ground voltage. Similar to the other test circuits 500-800 described herein, the test circuit 900 may operate by passing a current Ileak through the target TSV 910' through the target TSV 910' and amplifying a voltage generated by the current Ileak. Unlike the previously discussed test circuits, in the test circuit 900 an additional resistor RLS 942 is provided to generate a voltage from Ileak. In some embodiments, the additional resistor RLS may be a component of the switch circuit 430 of FIG. 4.

In the example configuration of test circuit 900, all of the TSV buffer circuits 940a-b are deactivated, except for the TSV buffer circuit 940a coupled to the target TSV 910', which is activated. The current supply circuit 938 is also deactivated. In some embodiments, the force amplifier 934 may be deactivated. The additional resistor 942 may be coupled between the first and second inputs of the amplifier 932. The first input of the amplifier may also be coupled to the power supply voltage Vdd. The second input of the amplifier may be coupled to the target TSV 910' via the signal TSV 936 and the TSV buffer circuit 940a.

The leak current Ileak may flow from Vdd through the additional resistor 942, sense TSV 936, TSV buffer circuit 940a, target TSV 910', and short path 918 to ground. The amplifier 932 may amplify a voltage across the additional resistor 942 generated by the current Ileak. The voltage Vdif1 across the additional resistor 942 may be given by equation 2 below:

$$Vdif1 = Vdd - RLS*Ileak \qquad \text{Eqn. 2}$$

Figure 10:
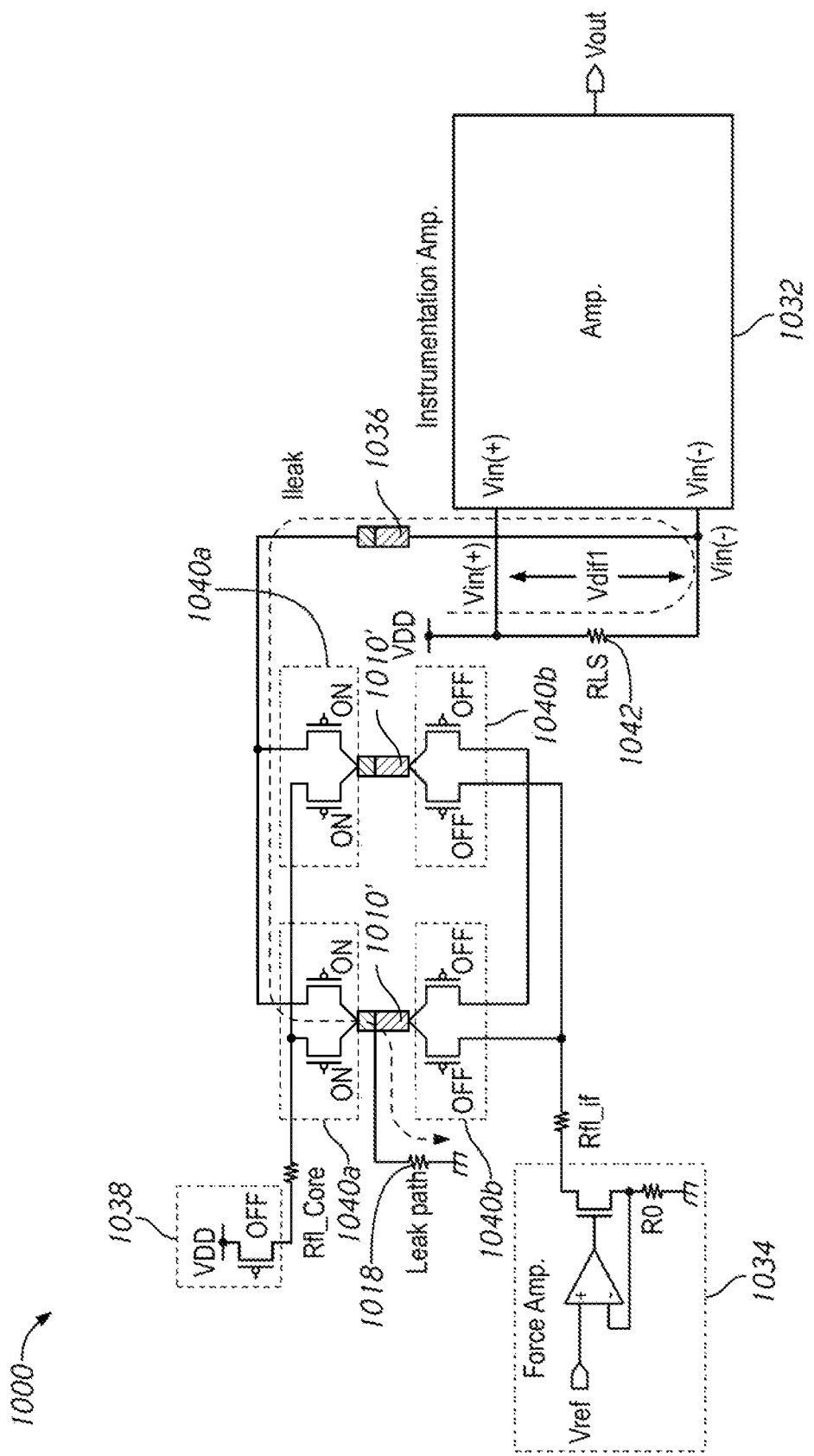
FIG. 10 is a schematic diagram of a TSV gross leak test circuit according to an embodiment of the present disclosure.

FIG. 10 shows a schematic diagram of a TSV gross leak test circuit 1000 according to an embodiment of the present disclosure. The test circuit 1000 may generally be similar to the test circuits 900 of FIG. 9. The test circuit 1000 may be established by couplings through the switch circuit 430 of FIG. 4 and/or selective activation of circuit components (e.g., the current supply circuit 1038, TSV buffer circuits 1040a-b, etc.). For the sake of brevity, components similar to those already described in regards to FIGS. 4-8 will not be described again in detail here. The test circuit 1000 may determine/measure a short (or leak) path 1018 similar to the test circuit 900 of FIG. 9. However, unlike the test circuit 900 which involve a single target TSV 910', the test circuit 1000 may determine/measure a leak path 1018 of a plurality of target TSVs 1010'. In some embodiments the plurality of target TSVs 1010' may be all of the signal TSVs in a memory die, or may be a group of signal TSVs in the memory die.

In general, the test circuit 1000 may make the same connections between circuit elements made for the test circuit 900. However, in the test circuit 1000, the TSV buffer circuits 1040a of each of the target TSVs 1010' to be tested are activated. Accordingly the voltage Vdif1 across the additional resistor 1042 may depend on the current Ileak as it flows through leakage paths 1018 coupled to any of the activated target TSVs 1010'.

Figure 11:
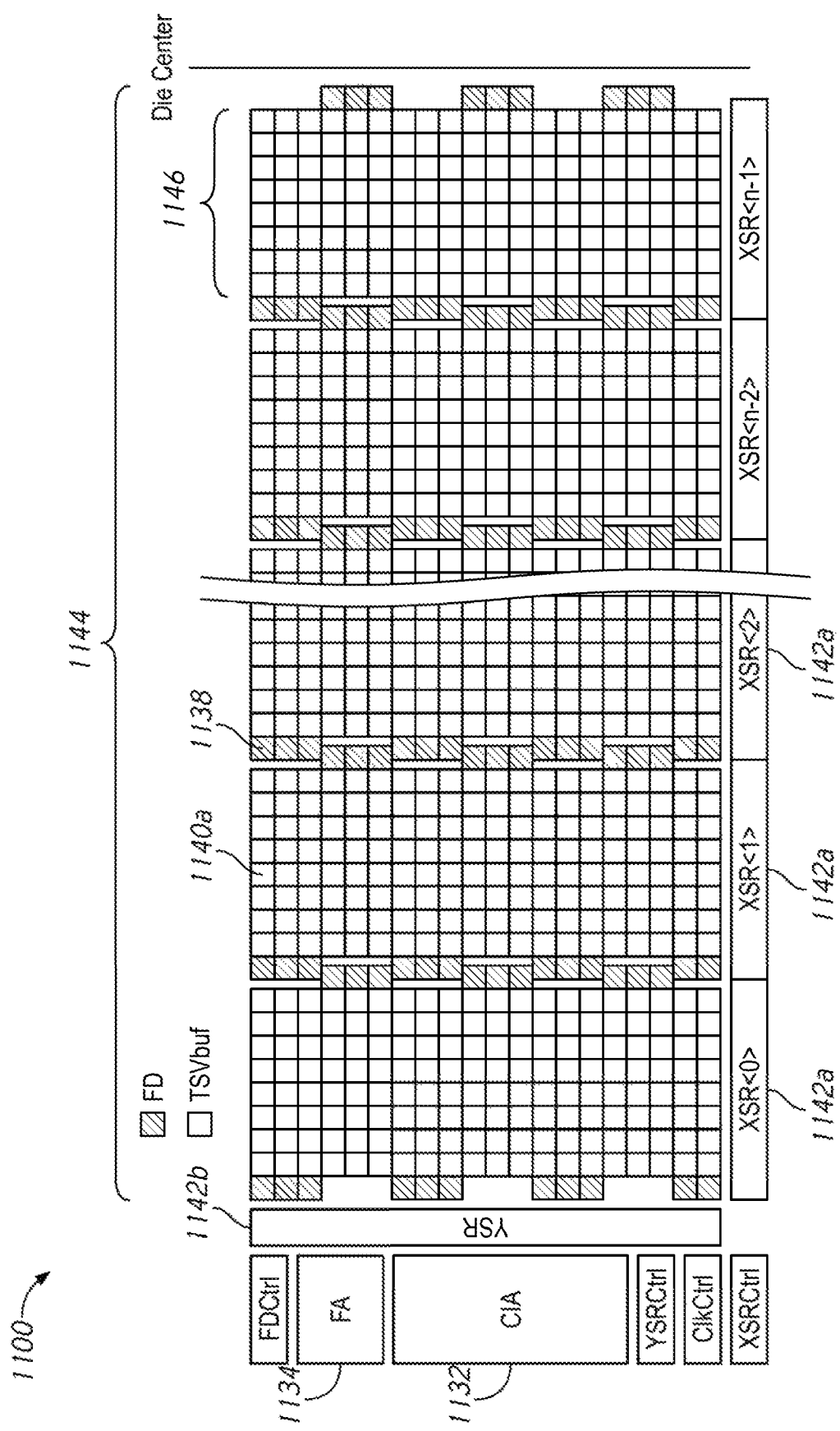
FIG. 11 is a schematic diagram of a memory device according to an embodiment of the present disclosure.

FIG. 11 shows a memory device 1100 according to an embodiment of the present disclosure. The memory device 1100 may be the memory device 400 of FIG. 4 in some embodiments. The memory device 1100 may be used to operate the test circuit 1000 of FIG. 10. For the sake of clarity certain components and couplings of the test circuit 1000 are not shown in the view of the memory device 1100. The memory device 1100 may be shown as a 'top down' view as opposed to the cross-section view represented in FIG. 4. TSV buffer circuits 1140a (and corresponding TSVs) may be arranged in a grid to form a TSV block. Columns of current supply circuits 1138 may be arranged between groupings of TSV buffer circuits 1140a in the TSV block. Other components of the die 1100 such as x-shift registers 1142a and y-shift register 1142b may be arranged around a periphery of the TSV block. The memory device 1100 includes force amplifier 1134 and amplifier 1132, which are also positioned in an area of the die 1100 outside the area containing the TSV block 1144. It is to be understood that the amplifier 1132 and/or force amplifier 1134 may be located in a different layer of the device (e.g., in the IF die 404) from the TSV block and shift registers (which may be, for example, in each of the memory dies 402a-b).

The x-shift registers 1142a may be a plurality of different shift registers XSR<i> (where i is an index counter from 0 to n), each corresponding to one of n different sub-groups 1146 of the TSV block 1144. As shown in FIG. 1, each grouping (sub-block) 1146 of the TSV block 1144 includes 8 columns and 20 rows of TSV buffer circuits 1140a. Each sub-block 1146 may be further subdivided based on their couplings to current supply circuits 1138. Each row of a sub-block 1146 may be coupled to a current supply circuit 1138. The first 3 rows may each be coupled to a current supply circuit 1138 positioned on the left side of the row. The next 3 rows may be coupled to a current supply circuit 1138 positioned on the right side of the row. The placement of the current supply circuit 1138 may alternate every 3 rows. Accordingly, going down a column of current supply circuits 1138 in the TSV block, they may alternate whether they are coupled to the left or right every 3 rows. Other layouts (e.g., spacings of more or less than 3 rows, counting up from the bottom row to the top, starting on the right side) are possible in other examples.

The memory device 1100 may be used to operate one or more of the test circuits 500-1000 described in FIGS. 5-10. As an example, the memory device 1100 may operate the signal to Vss TSV short test circuit 900 of FIG. 9 and the TSV gross leak test circuit 1000 of FIG. 10. Different groupings of TSVs may be tested at a time. For example, an entire die may be tested at once for a pass/rejection determination. As another example, smaller groups of TSVs may be tested in order to narrow down a leakage occurrence as part of a failure analysis. When it is desired to test the short of only a single TSV, the x- and y-shift registers 1142a,b may be operated such that only a single TSV is activated (e.g., by activating only a single row and column). In some cases, multiple sub-blocks may be activated but only a single one of the x-shift registers 1142a may be coupled to the amplifier 1132. When it is desired to test multiple TSVs at once, the x- and y-shift registers 1142a-b may be operated to activate multiple TSV buffer circuits 1140a (e.g., by activating multiple rows and columns). One or more of the x-shift registers 1142a may be coupled to the amplifier 1132.

Figure 12:
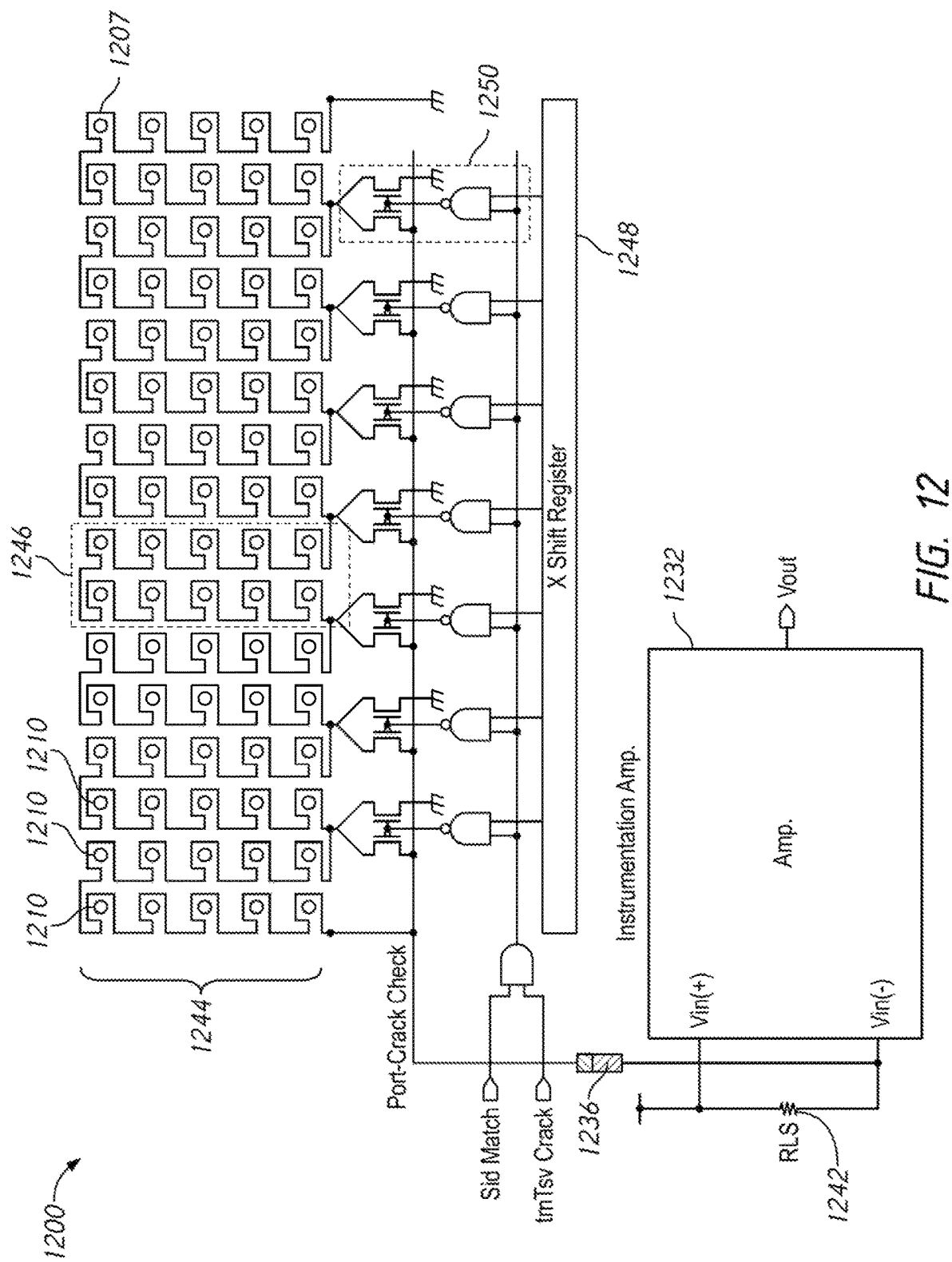
FIG. 12 is a schematic diagram of a TSV crack test circuit according to an embodiment of the present disclosure.
Figure 13:
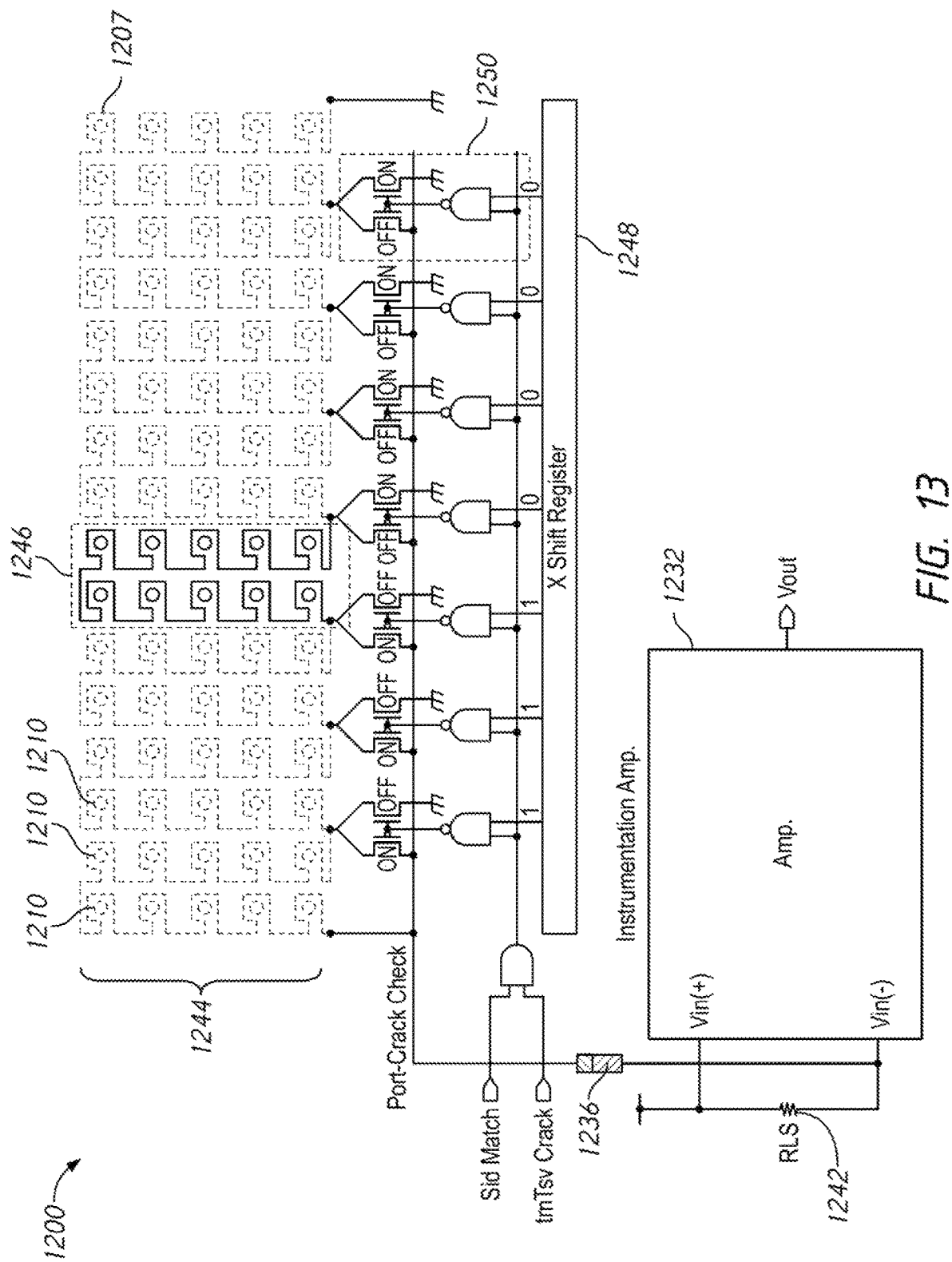
FIG. 13 is a schematic diagram of the operation of a TSV crack test circuit according to an embodiment of the present disclosure.

FIGS. 12-13 are schematic diagrams of a TSV crack test circuit 1200 according to an embodiment of the present disclosure. The test circuit 1200 may be established by couplings through the switch circuit 430 of FIG. 4 and/or selective activation of circuit components (e.g., the current supply circuit 1038, TSV buffer circuits 1040a-b, etc.). For the sake of brevity, components similar to those already described in regards to FIGS. 4-11 will not be described again in detail here. The TSV crack test circuit 1200 may be used to determine if there is a crack (or other physical defect) in a surface of a die (e.g., memory dies 402a-b of FIG. 4). In some embodiments, the test circuit 1200 may be used to determine the presence of cracks in or around a portion of the die containing a TSV block 1244 including some number of signal TSVs 1210.

The test circuit 1200 may include may include a crack test path 1207. The circuit path 1207 may be a conductive element which is positioned about the TSV block 1244. In some embodiments, the circuit path 1207 may, at least partially, surround a perimeter of each TSV 1210 of the TSV block 1246. The crack circuit path 1207 may, for example, follow a path around all, or a portion, of the perimeter of each of the TSVs 1210. The circuit path 1207 may wrap around the TSVs 1210 without being coupled to the TSVs 1210. One end of the circuit path 1207 may be coupled to a ground voltage (e.g., Vss). The other end of the circuit path 1207 may be coupled (through sense TSV 1236) to a second input of an amplifier 1232. Similar to the test circuit 1000 of FIG. 10, the first input of the amplifier 1232 may be coupled to a power supply voltage Vdd, and the first and second inputs of the amplifier may be coupled together through a resistor 1242 with a resistance RLS.

The crack test path 1207 may be connected to one or more measurement taps 1250. The crack test path 1207 may be divided into measurement regions 1246 which may be sections of the crack test path 1207 between where any two measurement taps 1250 are coupled (there are also measurement regions 1246 before the first measurement tap 1246 and after the last measurement tap 1246). The measurement taps 1250 may be used to selectively determine/measure cracks along each measurement region 1246 of the crack test path 1207. The measurement taps may be coupled to control signals (e.g., SidMatch and/or tmTsvCrack) and/or a shift register 1248.

In one embodiment, each measurement tap 1250 may comprise a pair of transistors, a sense transistor and a ground transistor. The sense transistor and the ground transistor may be opposite types of transistor. For example, the sense transistor may be a p-type transistor with a source coupled to the crack test path 1207 and a drain coupled to the sense TSV 1236. The ground transistor may be an n-type transistor with a source coupled to the crack test path 1207 and a drain coupled to a ground voltage (e.g., Vss). The gates of both transistors may be commonly coupled to the output of a NAND logic gate. The NAND logic gate may accept as inputs a command signal line and one of the values of the shift register 1248.

FIG. 13 shows the operation of the crack detection test circuit 1200. The two command signals SidMatch and TsvCrack may both be in a positive state. SidMatch may be positive (e.g., a high logic level, Vdd) in the layer containing the test circuit 1200 that is to be operated and negative (e.g., a low logic level, a ground voltage) in all other layers. The command signal TsvCrack may be active to indicate that a crack test is occurring. Both command signals are coupled to an AND gate, which provides an output to one terminal of the NAND gates of the measurement taps 1250. The AND gate may only provide a positive signal (e.g., a high logic value, Vdd) when both of the coupled command signals are positive, which indicates that a crack test is occurring in the particular level. The other input terminal of each of the NAND gates of the measurement taps 1250 are connected to a digit of the shift register 1248.

As the shift register 1248 is operated, one of the digits of the shift register 1248 is changed from a low logic level (a '0') to a high logic level ('1') in sequence across the shift register 1248 (as shown, from left to right). Because the two transistors in each of the measurement taps 1250 are of opposite types, one of the transistors is 'on' (allowing current to flow), while the other is 'off' (blocking current flow). Assuming that both of the command signals SidMatch and TsvCrack are active, the value of the coupled digit of the shift register 1248 may determine the activation state of each of the measurement taps 1250. An activated measurement tap 1250 coupled to a shift register 1248 digit with a value of '1' may have an active sense transistor and an inactive ground transistor, which may couple the crack test path 1207 to the sense TSV 1236 at the point where the measurement tap 1250 is coupled to the crack test path 1207. A non-activated measurement tap 1250 coupled to a shift register 1248 digit with a value of '0' may have an active ground transistor and an inactive sense transistor, which may couple the crack test path 1207 ground at the point where the measurement tap 1250 is coupled to the crack test path 1207.

In this manner, a measurement region 1246 may be activated between a measurement tap 1250 coupled to a shift register 1248 value of '1' and a measurement tap 1250 coupled to a shift register value of '0'. When there is not a crack in the activated measurement region 1246 (e.g., when the circuit path 1207 is unbroken in that region), there may be a voltage difference Vdif1 of about Vdd across the resistor 1242. If there is a break or partial break (e.g., an increase in the resistance due to a manufacturing defect) along the activated measurement region 1246, then the voltage Vdif1 will decrease, and the output voltage Vout of the amplifier 1232 will also decrease.

Figure 14:
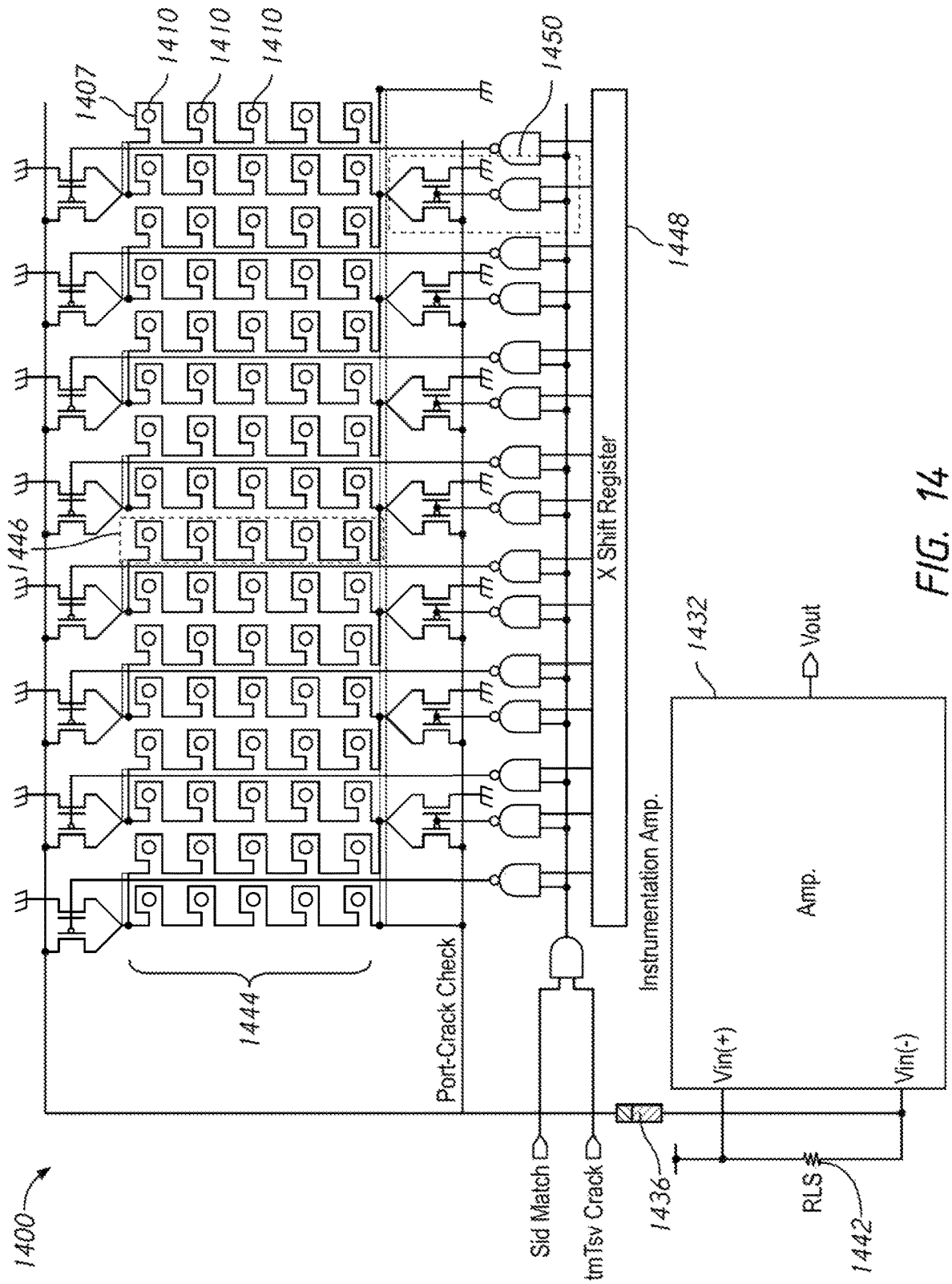
FIG. 14 is a schematic diagram of an alternate TSV crack test circuit according to an embodiment of the present disclosure.
Figure 15:
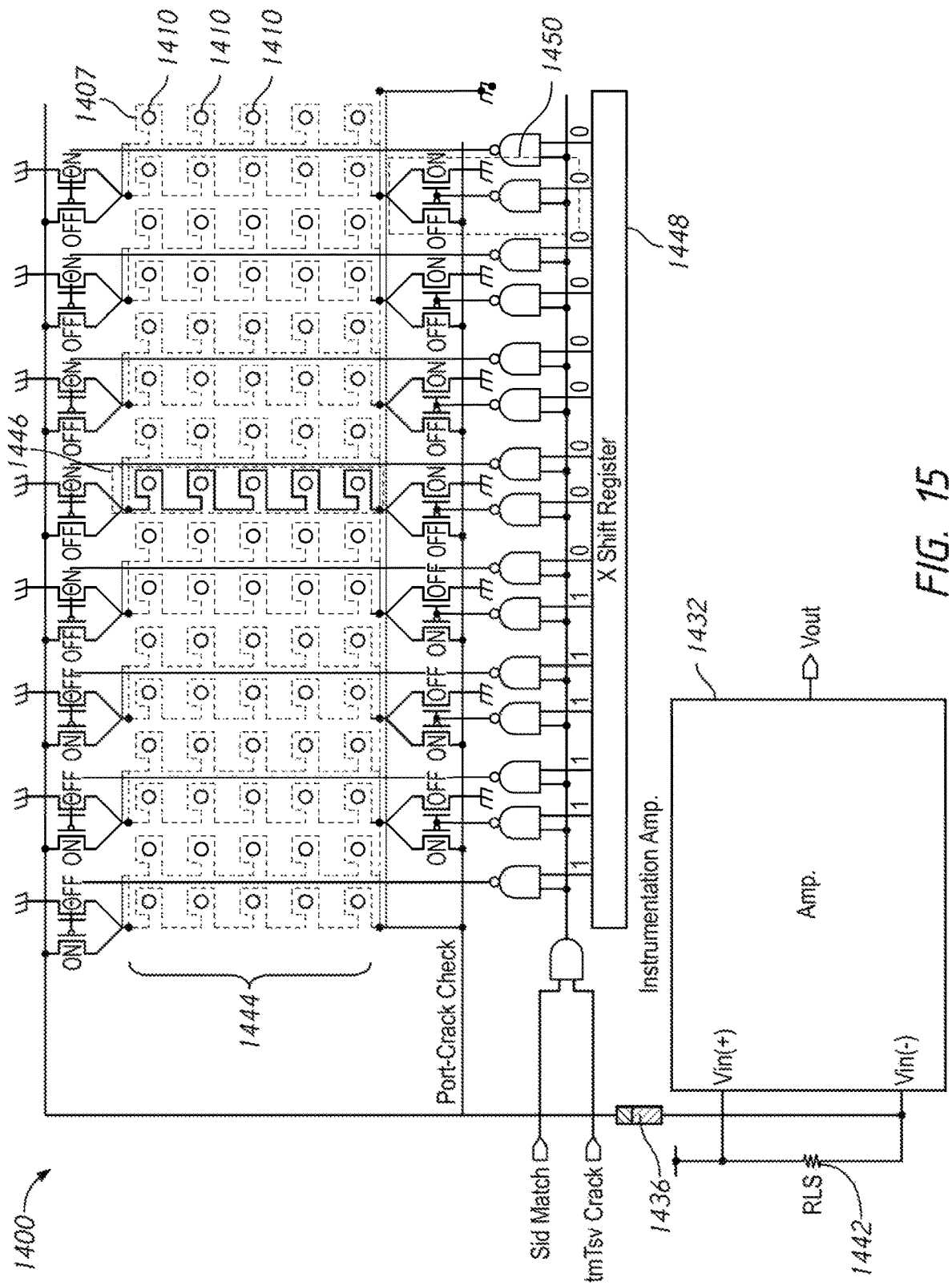
FIG. 15 is a schematic diagram of the operation of an alternate crack test circuit according to an embodiment of the present disclosure.

FIGS. 14-15 are schematic diagrams of a TSV crack test circuit 1400 according to an embodiment of the present disclosure. The test circuit 1400 may be established by couplings through the switch circuit 430 of FIG. 4 and/or selective activation of circuit components (e.g., the current supply circuit 438, TSV buffer circuits 440a-b, etc.). The test circuit 1400 may generally be similar to the test circuit 1200 of FIG. 12. For the sake of brevity, components similar to those already described in regards to FIGS. 12-13 will not be described again in detail here.

In comparison to the test circuit 1200, in the test circuit 1400, the measurement taps 1450 may be arranged on opposite sides of the TSV block 1444. The measurement taps 1450 may be alternately arranged along the opposite sides of the TSV block 1444 along the crack test path 1407. Accordingly, the measurement region 1446 between each pair of measurement taps 1450 may be only a single column of TSVs 1410. The shift register 1448 and measurement taps 1450 may generally be located in or around the area defined by the TSV block 1444. The amplifier 1442 may be located outside of the area defined by the TSV block 1444. The shift register 1448 and measurement taps 1450 may have a decreased size (e.g., less circuit overhead) compared to the amplifier 1442.

Figure 16:
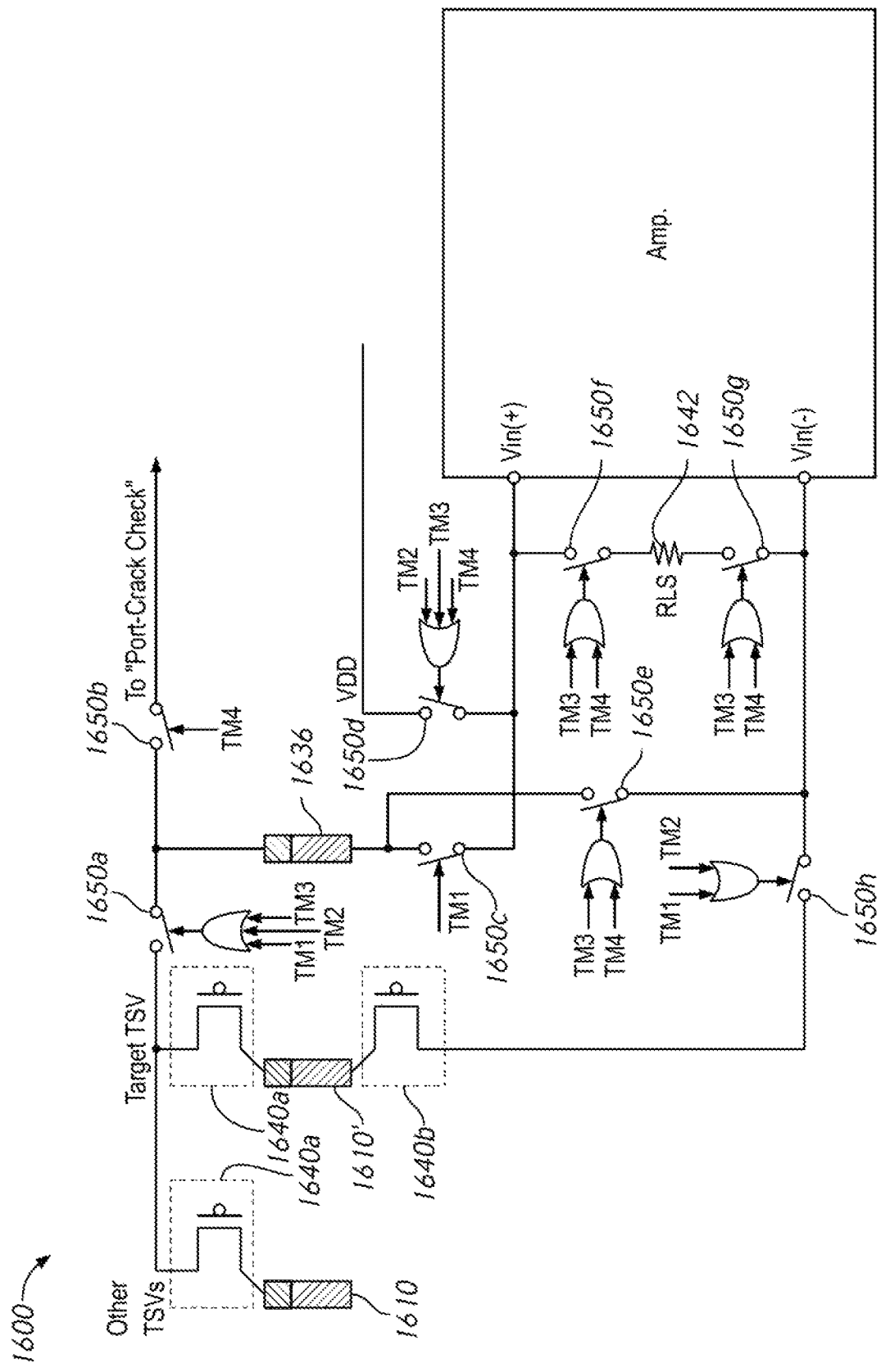
FIG. 16 is a schematic diagram of a switch circuit according to an embodiment of the present disclosure.

FIG. 16 is a schematic diagram of a switch circuit 1600 according to an embodiment of the present disclosure. The switch circuit 1600 may be an implementation of the switch circuit 430 of FIG. 4. The switch circuit 1600 is shown coupled to an amplifier 1632 as well as to a sense TSV 1636, target TSV 1610', other signal TSVs 1610 and TSV buffer circuits 1640*a-b*. The switch circuit 1600 may include an additional resistor 1642 as well as a plurality of switches 1650*a-h*, each of which may be coupled to one or more command signals TM1-4.

The switch circuit 1600 may be used to configure a memory device (e.g., the memory device 400 of FIG. 4) for one or more of the test circuits described in FIGS. 5-15. The switch circuit 1600 may receive command signals TM1-4. Each of the command signals TM1-4 may correspond with one of the test circuit configurations. In the particular embodiment of switch circuit 1600, TM1 corresponds to the signal to signal TSV test circuit (e.g., test circuit 600 of FIG. 6), TM2 corresponds to the signal to Vdd TSV test circuit (e.g., test circuit 800 of FIG. 8), TM3 corresponds to a signal to Vss TSV test circuit (e.g., test circuit 900 of FIG. 9), and TM4 corresponds to a TSV crack test circuit (e.g., test circuits 1200-1400 of FIGS. 12-15). The command signals TM1-4 may be provided to one or more switches 1650*a-h* to selectively activate the switch 1650*a-h* when one (or more) of the command signals TM1-4 coupled to it is active. When a switch is coupled to more than one of the command signals TM1-4, it may be coupled to the command signals TM1-4 through an OR logic gate, which may provide a positive signal when any of the coupled command signals is positive. The switch may close (activate) in response to a positive signal and open in response to a negative signal. In some embodiments, each of the switches 1650*a-h* may be a solid state device such as a transistor.

The switch 1650*a* is coupled between the signal TSVs 1610 (including target TSV 1610') and the sense TSV 1636. The switch 1650*a* may be activated by any of the command signals TM1-3 (e.g., any of the test circuits that involve one or more signal TSVs 1610). The switch 1650*b* may be coupled between the sense TSV 1636 and crack test path (e.g., test circuits 1200 and 1400 of FIGS. 12-15) and may be activated in response to command signal TM4. The switch 1650*c* may selectively couple the sense TSV 1636 to a first input of the amplifier 1632 in response to the command signal TM. The switch 1650*d* may selectively couple a power supply voltage to the first input of the amplifier 1632 in response to any of the command signals TM2-4. The switch 1650*e* may selectively couple the sense TSV 1636 to a second input of the amplifier 1632 in response to any of command signals TM3 or TM4. The switch 1650*f* may couple the first input of the amplifier 1632 to additional resistor 1642 in response to either TM3 or TM4. The switch 1650*g* may similarly couple another side of the additional resistor 1642 to the second input of the amplifier 1632 also in response to activation of either TM3 or TM4. The switch 1650*h* may selectively couple the second input of the amplifier 1632 to the TSV buffer(s) 1640*b* in response to activation of the command signals TM1 or TM2.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   an interface (IF) die; and
   at least one memory die, wherein the at least one memory die is stacked over the IF die through a plurality of through substrate vias (TSVs),
   wherein the IF die comprises:
      a switch circuit configured to select one of a plurality of tests; and
      an instrumentation amplifier configured to be coupled to a target TSV of the plurality of TSVs, to perform the selected one of the plurality of tests, the plurality of tests including:
         a first test to measure a first voltage drop related to a voltage drop between the target TSV of the plurality of TSVs and one or more other TSVs of the plurality of TSVs;
         a second test to measure a second voltage drop related to a voltage drop between the target TSV of the plurality of TSVs and a first power supply line;
         a third test to measure a third voltage drop related to a voltage drop between the target TSV of the plurality of TSVs and a second power supply line; and
         a fourth test to measure a fourth voltage drop related to a voltage drop across a conductive line formed around the plurality of TSVs.

2. The apparatus of claim 1,
   wherein the instrumentation amplifier includes first and second input nodes; and
   wherein the first test is performed by:
      flowing a current through the target TSV and the one or more other TSVs,
      coupling the first input node of the instrumentation amplifier to the target TSV, and
      coupling the second input node of the instrumentation amplifier to one or more TSV.

3. The apparatus of claim 1,
   wherein the instrumentation amplifier includes first and second input nodes; and
   wherein the second test is performed by:
      flowing a current through the target TSV between the first and second power lines,
      coupling the first input node of the instrumentation amplifier to the first power line, and
      coupling the second input node of the instrumentation amplifier to target TSV.

4. The apparatus of claim 1,
   wherein the IF die further comprises a resistor;
   wherein the instrumentation amplifier includes first and second input nodes; and
   wherein the third test is performed by:
      coupling the resistor between the first and second input nodes of the instrumentation amplifier, and
      flowing a current into the target TSV through the resistor between the first and second power lines.

5. The apparatus of claim 1,
   wherein the IF die further comprises a resistor;
   wherein the instrumentation amplifier includes first and second input nodes; and wherein the fourth test is performed by:
coupling the resistor between the first and second input nodes of the instrumentation amplifier, and
flowing a current into the conductive line through the resistor between the first and second power lines.

6. An apparatus comprising:
an interface (IF) die comprising an amplifier coupled to a switch circuit; and
a memory die stacked on the IF die, the memory die comprising a plurality of test circuits selectively configurable to perform at least a first type of test configured to measure a first voltage drop and a second type of test configured to measure a second voltage drop,
wherein the switch circuit is coupled to the plurality of test circuits, and
wherein the switch circuit is configured to selectively couple one or more test circuits of the plurality of test circuits to the amplifier.

7. The apparatus of claim 6, wherein the amplifier is an instrumentation amplifier.

8. The apparatus of claim 6, wherein the memory die comprises a plurality of through substrate vias (TSVs) arranged in a TSV block.

9. The apparatus of claim 8, wherein the amplifier is positioned in an area of the IF die which is outside and area vertically aligned with the TSV block.

10. The apparatus of claim 8, wherein each of the plurality of TSVs are selectively coupled to the plurality of test circuits via a TSV buffer circuit.

11. The apparatus of claim 10, wherein the plurality of TSV buffer circuits are coupled to a first shift register and a second shift register in the memory die.

12. The apparatus of claim 8, wherein the plurality of TSVs are selectively coupled to a power supply voltage via a current supply circuit.

13. The apparatus of claim 6, wherein switch circuit comprises a plurality of switches, wherein each of the plurality of switches is coupled to one or more of a plurality of control signals, each of the plurality of control signals corresponding to one of the plurality of test circuits.

14. An apparatus comprising:
a memory die comprising a plurality of TSVs, wherein the TSVs are arranged in a TSV block; and an IF die comprising:
an amplifier selectively coupled to the TSVs, wherein the memory die is stacked on the IF die, the IF die has a TSV block which is vertically aligned with the TSV block of the stacked memory die, and wherein the amplifier is positioned in an area of the IF die outside of the TSV block; and
a switch circuit coupled to a plurality of test circuits, and configured to selectively couple the amplifier to one or more test circuits of the plurality of test circuits, wherein the plurality of test circuits are selectively configurable to perform at least a first type of test configured to measure a first voltage drop and a second type of test configured to measure a second voltage drop.

15. The apparatus of claim 14, wherein the plurality of TSVs of the TSV block are arranged in a grid, and wherein the memory die further comprises current supply circuits which are positioned in the TSV block and arranged in columns in between columns of the plurality of TSVs.

16. An apparatus comprising: a plurality of through silicon vias (TSVs); a crack test path, wherein the crack test path at least partially surrounds a perimeter of each of the plurality of TSVs; a plurality of measurement taps coupled to the crack test path; a shift register coupled to the plurality of measurement taps, wherein the shift register selectively activates one or more of the plurality of measurement taps to determine an active measurement region of the crack test path; and an amplifier coupled to the active measurement region, wherein the shift register comprises a plurality of digits, wherein each digit is coupled to one of the plurality of measurement taps, and wherein the value of the digit determines the activation state of the coupled measurement tap.

17. The apparatus of claim 16, wherein the plurality of TSVs are arranged in a TSV block, and wherein the plurality of measurement taps are alternately arranged on opposite sides of the TSV block.

18. A apparatus comprising: an plurality of through silicon vias (TSVs); a crack test path, wherein the crack test path at least partially surrounds a perimeter of each of the plurality of TSVs; a plurality of measurement taps coupled to the crack test path, wherein each measurement tap of the plurality of measurement tap comprises a sense transistor; a shift register coupled to the plurality of measurement taps, wherein the shift register selectively activates one or more of the plurality of measurement taps to determine an active measurement region of the crack test path; and an amplifier coupled to the active measurement region, wherein the active measurement region comprises a portion of the crack test path including one end coupled to an activated measurement tap and another end coupled to a non-activated measurement tap.

* * * * *